US009252143B2

(12) United States Patent
Vorhaus

(10) Patent No.: US 9,252,143 B2
(45) Date of Patent: Feb. 2, 2016

(54) RADIO FREQUENCY AND MICROWAVE DEVICES AND METHODS OF USE

(71) Applicant: Sarda Technologies, Inc., Durham, NC (US)

(72) Inventor: James L. Vorhaus, Chapel Hill, NC (US)

(73) Assignee: Sarda Technologies, Inc., Durham, NC (US)

( * ) Notice: Subject to any disclaimer, the term of this patent is extended or adjusted under 35 U.S.C. 154(b) by 0 days.

(21) Appl. No.: 14/827,240

(22) Filed: Aug. 14, 2015

(65) Prior Publication Data
US 2015/0357323 A1 Dec. 10, 2015

Related U.S. Application Data

(63) Continuation of application No. 14/628,214, filed on Feb. 21, 2015, now Pat. No. 9,136,265, which is a continuation of application No. 14/532,828, filed on Nov. 4, 2014, now Pat. No. 9,006,799, which is a continuation of application No. 13/449,280, filed on Apr. 17, 2012, now Pat. No. 8,896,034, which is a continuation-in-part of application No. 13/205,433, filed on Aug. 8, 2011, now Pat. No. 8,519,916.

(60) Provisional application No. 61/372,513, filed on Aug. 11, 2010.

(51) Int. Cl.
| | |
|---|---|
| *H01L 29/80* | (2006.01) |
| *H01L 29/812* | (2006.01) |
| *H01L 27/118* | (2006.01) |
| *H01L 27/06* | (2006.01) |
| *H01L 27/02* | (2006.01) |
| *H01L 29/417* | (2006.01) |
| *H01L 29/20* | (2006.01) |
| *H03F 3/193* | (2006.01) |
| *H01L 27/088* | (2006.01) |

(52) U.S. Cl.
CPC ........ *H01L 27/0629* (2013.01); *H01L 27/0207* (2013.01); *H01L 27/088* (2013.01); *H01L 29/20* (2013.01); *H01L 29/2003* (2013.01); *H01L 29/4175* (2013.01); *H03F 3/193* (2013.01); *G09G 2300/0842* (2013.01); *G09G 2300/0861* (2013.01); *H01L 2924/00* (2013.01); *H01L 2924/00014* (2013.01); *H03F 2200/451* (2013.01)

(58) Field of Classification Search
CPC ............ H01L 29/2003; H01L 29/4175; H01L 2924/00; H01L 2924/00014; H01L 27/088; H01L 27/0207; H01L 27/027; H01L 27/0629; H01L 23/5226; H03F 3/193; G09G 2300/0842; G09G 2300/0861
USPC ........... 257/76, 256, 259, 279, 289, 347, 386, 257/397, 724, E29.09, E29.127, E29.151, 257/E29.312, E27.111, E21.431; 345/55, 345/76; 438/301, 487
See application file for complete search history.

(56) References Cited

U.S. PATENT DOCUMENTS 8,513,707 B2 * 8/2013 Herberholz ......... H01L 29/0692
257/202

(Continued)

*Primary Examiner* — Dao H Nguyen
(74) *Attorney, Agent, or Firm* — Carr & Ferrell LLP

(57) ABSTRACT

Radio frequency and microwave devices and methods of use are provided herein. According to some embodiments, the present technology may comprise an ohmic layer for use in a field effect transistor that includes a plurality of strips disposed on a substrate, the plurality of strips comprising alternating source strips and drain strips, with adjacent strips being spaced apart from one another to form a series of channels, a gate finger segment disposed in each of the series of channels, and a plurality of gate finger pads disposed in an alternating pattern around a periphery of the plurality of strips such that each gate finger segment is associated with two gate finger pads.

21 Claims, 22 Drawing Sheets

(56) References Cited

U.S. PATENT DOCUMENTS

| | | | |
|---|---|---|---|
| 8,952,424 B2 * | 2/2015 | Herberholz | H01L 29/0692 257/204 |
| 2004/0164407 A1 * | 8/2004 | Nakajima | H01L 23/3107 257/724 |
| 2007/0228424 A1 * | 10/2007 | Igarashi | H01L 27/0207 257/256 |
| 2009/0095989 A1 * | 4/2009 | Kim | H01L 29/772 257/259 |
| 2012/0267795 A1 * | 10/2012 | Shimura | H01L 23/4821 257/776 |

* cited by examiner

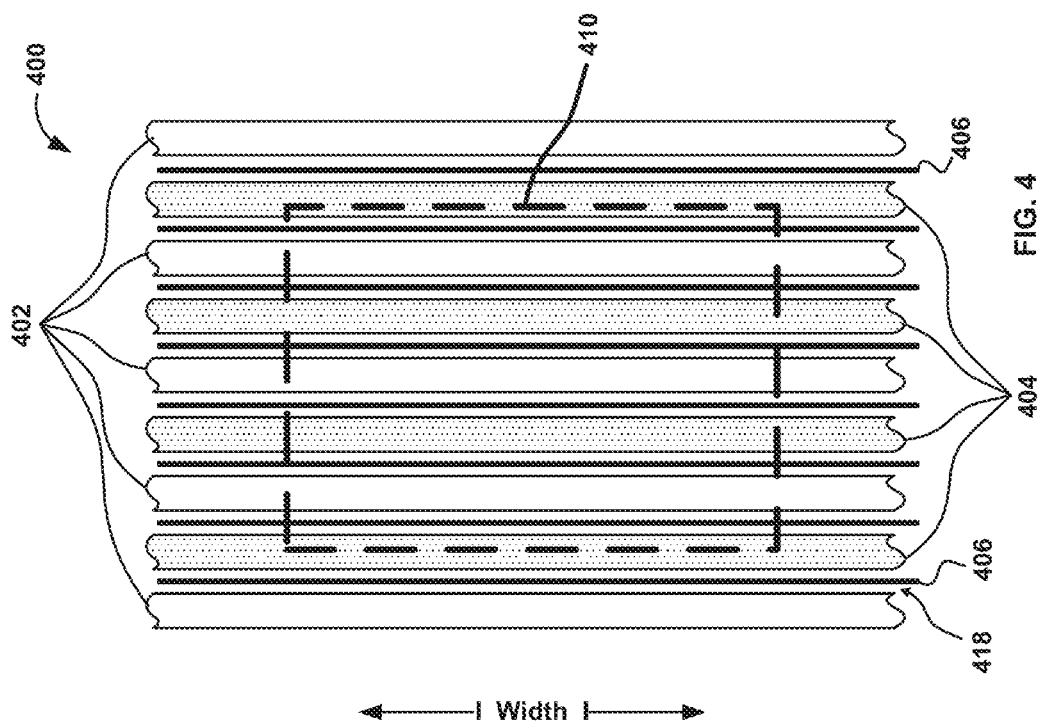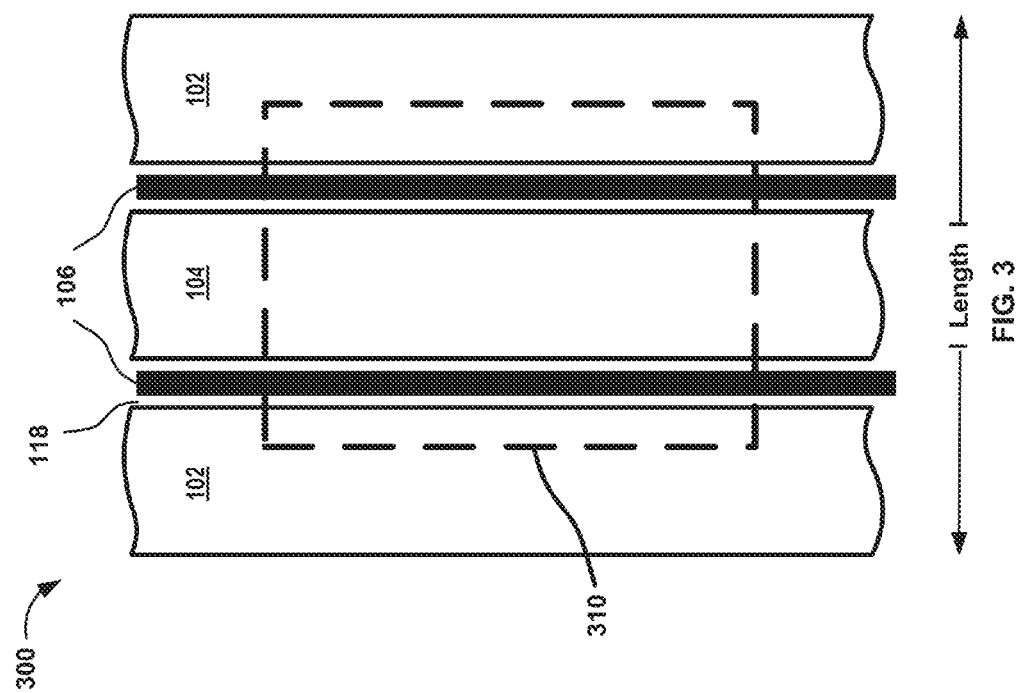

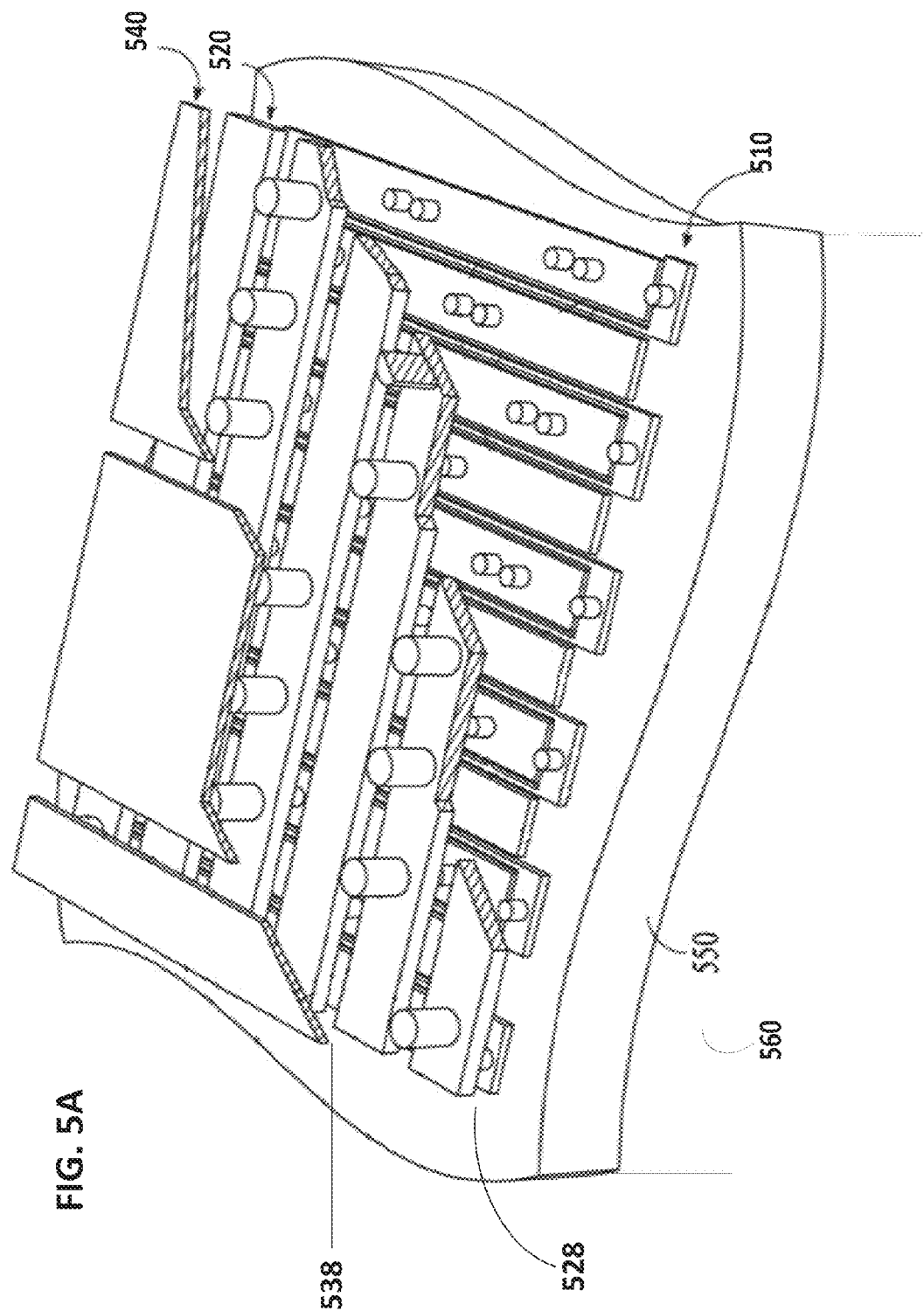

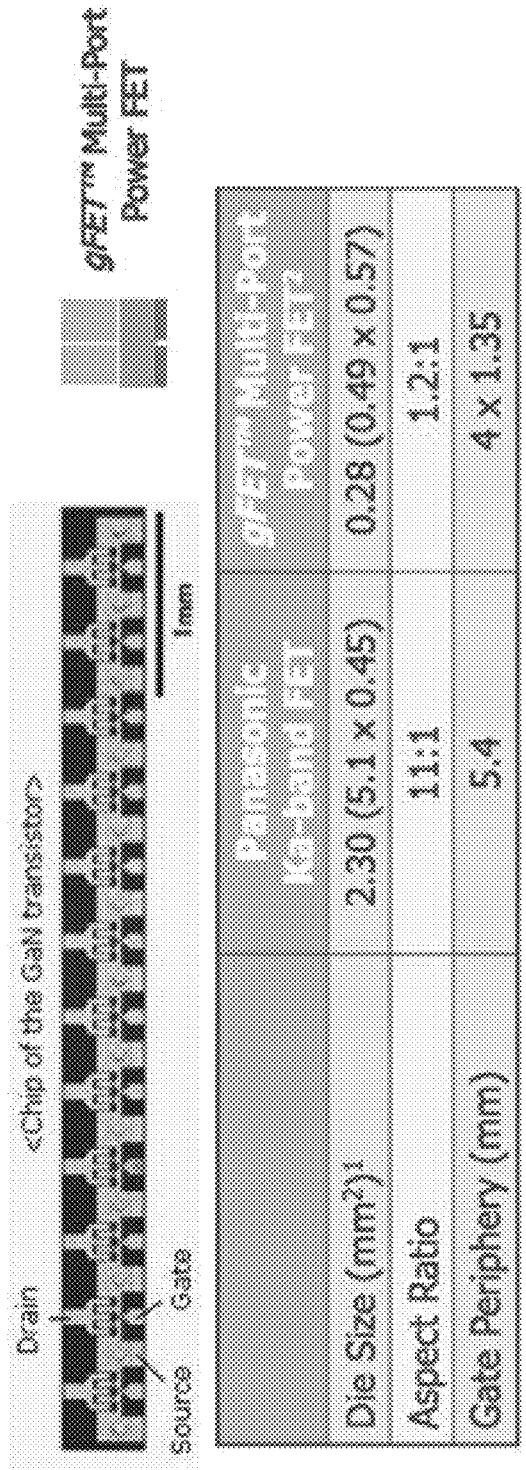

|  | Panasonic (G-band FET) | gFET™ Multi-Port Power FET |
|---|---|---|
| Die Size (mm²)[1] | 2.30 (5.1 × 0.45) | 0.28 (0.49 × 0.57) |
| Aspect Ratio | 11:1 | 1.2:1 |
| Gate Periphery (mm) | 5.4 | 4 × 1.35 |

- Higher output impedance for easier matching
- More die per wafer (>8x) with the MPBP device
- Much easier die handling because of better aspect ratio
- Elimination of 24 wire bonds and accompanying yield impact and performance degradation due to bond length variation

[1]Includes dicing street
[2]Calculated based on target gate periphery

RADIO FREQUENCY AND MICROWAVE DEVICES AND METHODS OF USE

CROSS REFERENCE TO RELATED APPLICATIONS

The present application is a continuation of and claims priority benefit from U.S. patent application Ser. No. 14/628,214, filed Feb. 21, 2015 and entitled "Radio Frequency and Microwave Devices and Methods of Use," now U.S. Pat. No. 9,136,265 issued Sep. 15, 2015, which is a continuation of and claims priority benefit from U.S. patent application Ser. No. 14/532,828, filed Nov. 4, 2014 and entitled "Radio Frequency and Microwave Devices and Methods of Use," now U.S. Pat. No. 9,006,799 issued on Apr. 14, 2015, which is a continuation of and claims priority benefit from U.S. patent application Ser. No. 13/449,280, filed Apr. 17, 2012 and entitled "Radio Frequency and Microwave Devices and Methods Of Use," now U.S. Pat. No. 8,896,034 issued on Nov. 25, 2014, which is a continuation in part and claims priority benefit from U.S. patent application Ser. No. 13/205,433, filed Aug. 8, 2011 and entitled "Low Interconnect Resistance Integrated Switches," now U.S. Pat. No. 8,519,916 issued on Aug. 27, 2013, which claims the benefit of U.S. provisional patent application No. 61/372,513, filed Aug. 11, 2010 and entitled "Field Effect Transistor and Method of Making Same," the disclosures of which are incorporated herein by reference in their entirety.

FIELD OF THE TECHNOLOGY

Embodiments of the disclosure relate to radio frequency ("RF") and microwave circuits. The present technology may be utilized to create RF and microwave circuits with reduced die size. More specifically, but not by way of limitation, the present technology may employ novel compound semiconductor field effect transistors ("FET") that minimizes the size, and maximizes the yield, of the microwave device die, thus minimizing its manufacturing cost and, at the same time, provides an effective chip scale package structure with all electrical terminals on the same surface to facilitate easy flip-chip bonding.

BACKGROUND OF THE DISCLOSURE

FETs, particularly those fabricated from compound semiconductors such as Gallium Arsenide ("GaAs"), make very good signal amplification devices for RF and microwave applications. Chief among these are large-signal (or power) amplifier circuits. The FET's combination of high maximum frequency of oscillation, high current handling capability, high breakdown voltage and good linearity make these devices very attractive for such applications. Unfortunately, conventional FET devices have a relatively large size and therefore a relatively high manufacturing cost. Die size for a FET may be driven by at least two factors: (1) The requirement for many wide source and drain fingers in the active area of the device to support the large gate periphery, and (2) the large outboard bonding pads.

With regard to a standard FET, current flows between the source and the drain and the amount of current flowing is controlled by the voltage applied to the gate. Typically the source and drain fingers are approximately 25 microns each in width and the channel in which the gate is positioned is approximately five microns in width.

One major yield driver for a typical power FET device includes breaks in the gate fingers which may be no more than a few gate lengths (the small dimension, typically 0.25-0.5 microns) in size. Because the gate is only fed from one end, any break would leave the gate finger beyond the discontinuity unconnected from its voltage source and, therefore, unable to control the current flowing in that section of the channel. This effectively renders the device inoperable.

For example, suppose a power FET device has 50 gate fingers each two millimeters in width, giving a total gate periphery of 100 mm (a typical value for such a device). It will be assumed that the probability of any single one millimeter segment of gate finger ($Y_0$) not having a break in it is 99.9%, a typical fabrication yield for such devices. The probability of there not being a break in any one entire two millimeter gate finger would be $Y_f = Y_0^2 = 99.8\%$. Therefore, the probability of no breaks in any one of the 50 gate fingers is $Y_t = Y_f^{50} = 90.5\%$. So the overall device yield in the case where all the gate fingers are fed from one end is about 90%.

What is needed is an improved FET device that can be utilized in RF and microwave circuits that remedy the aforementioned deficiencies and create circuits that have relatively smaller die size, higher manufacturing yield, and greater reliability relative to common RF and microwave circuits.

SUMMARY OF THE DISCLOSURE

According to some embodiments, the present disclosure may be directed to a dual device for controlling two signals in parallel. The dual device includes an ohmic layer disposed on a compound semiconductor layer, the ohmic layer comprising: a plurality of common ohmic metal fingers disposed on the compound semiconductor layer, a plurality of first ohmic metal fingers having a width less than a width of the common ohmic metal fingers, the first ohmic metal fingers disposed alternating between a portion of the width of the common ohmic metal fingers, a plurality of second ohmic metal fingers having a width less than the width of the common ohmic metal fingers, the second ohmic metal fingers disposed alternating between a portion of the width of the common ohmic metal fingers, each of the second ohmic metal fingers in alignment with a first ohmic metal finger, a gap between each second ohmic metal finger and a respective first ohmic metal finger, a plurality of first gate fingers disposed between the first ohmic metal fingers and a portion of the common ohmic metal fingers, a plurality of second gate fingers disposed between the second ohmic metal fingers and a portion of the common ohmic metal fingers, a plurality of first inner gate pads each disposed between a first ohmic metal finger and a second ohmic metal finger, each of the first inner gate pads coupled to two of the first gate fingers, a plurality of second inner gate pads each disposed between a first ohmic metal finger and a second ohmic metal finger, each of the second inner gate pads coupled to two of the second gate fingers, each of the second of inner gate pads disposed between a second ohmic metal finger and a first inner gate pad, each of the first inner gate pads disposed between a first ohmic metal finger and a second inner gate pad, a plurality of first outer gate pads each disposed proximate a first end of a common ohmic metal finger and coupled to two first inner gate pads though two of the first gate fingers, and a plurality of second outer gate pads each disposed proximate a second end of a common ohmic metal finger and coupled to two second inner gate pads through two of the second gate fingers; a first dielectric material disposed on the ohmic layer; a first metal layer disposed on the first dielectric material, the first metal layer comprising: a plurality of a common metal strips disposed along the common ohmic metal fingers and coupled through the first dielectric material to the common ohmic metal fingers using vias, a plurality of first metal strips disposed between common metal strips above the first ohmic metal fingers and coupled through the first dielectric material to the first ohmic metal fingers using vias, a plurality of second metal strips disposed between common metal strips above the second ohmic metal fingers and coupled through the first dielectric material to the second ohmic metal fingers using vias, a plurality of first gate metal strips coupled through the first dielectric material to the first gate inner and outer pads using vias, and a plurality of second gate metal strips coupled through the first dielectric material to the second inner and outer gate pads using vias; a second dielectric material disposed on the first metal layer; and a second metal layer comprising: a common metal contact coupled through the second dielectric material to the common metal strips using vias, a first metal contact coupled through the second dielectric material to first metal strips using vias, a second metal contact coupled through the second dielectric material to second metal strips using vias, a first gate contact coupled through the second dielectric material to the first metal gate strips using vias, and a second gate contact coupled through the second dielectric material to the second gate metal strips using vias.

BRIEF DESCRIPTION OF THE DRAWINGS

The accompanying drawings, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments.

The methods and systems disclosed herein have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

FIG. 3 is a plan view illustrating a typical unit cell of section of active device area of the FET of FIG. 1.

FIG. 4 illustrates a unit cell of a section of a reduced size for a compound semiconductor FET, in accordance with embodiments of the technology.

FIG. 5A is a perspective cutaway view of a block diagram for a FET device according to various aspects of the technology.

FIG. 14 comprises a side-by-side comparison between the conventional high-output GaN transistor of FIG. 11 and the exemplary multi-port power device of FIG. 12, as well as a data comparison table.

DETAILED DESCRIPTION

In the following description, for purposes of explanation, numerous specific details are set forth in order to provide a thorough understanding of the disclosure. It will be apparent, however, to one skilled in the art, that the disclosure may be practiced without these specific details. In other instances, structures and devices are shown in block diagram form only in order to avoid obscuring the disclosure.

Generally speaking, the present technology contemplates improved FETs for use in RF and microwave devices. The use of these improved FETs in RF and microwave devices advantageously minimize the size and maximize the yield of RF and microwave die, minimizing manufacturing cost while also providing an effective chip scale package structure with all electrical terminals on the same surface to facilitate easy flip-chip bonding.

FETs, particularly those fabricated from compound semiconductors such as GaAs and/or GaN, make very good signal amplification devices for RF and microwave applications. Chief among these are large-signal (or power) amplifier circuits. The compound semiconductor FET's combination of high maximum frequency of oscillation, high current handling capability, high breakdown voltage and good linearity make these devices very attractive for such applications.

A FET device, such as the FET device of FIGS. 3-5C is a radical reimaging of the conventional power FET layout. The FET device design includes a number of changes in the basic FET structure that lead to a dramatic compaction of the device. It will be understood that the cost of a FET device chip is inversely related to its area. That is, the smaller the device is, the cheaper it is to manufacture since more die can be produced on each wafer. FET devices constructed in accordance with the present technology will hereinafter be referred to as "gFET" for the purposes of clarity. An exemplary gFET device may be significantly less expensive to manufacture than a conventional power FET device because of its much smaller die size.

Figure 1:
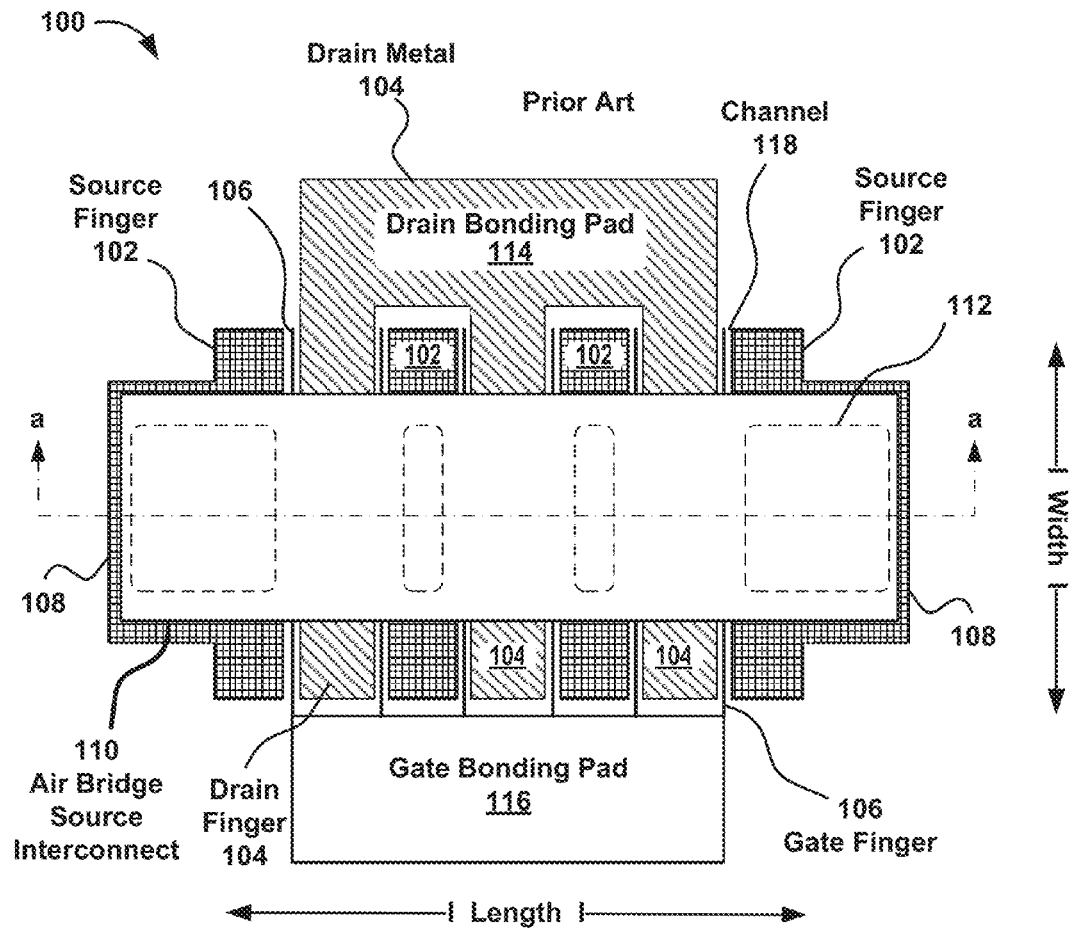
FIG. 1 shows a block diagram a conventional layout for a prior art large periphery power FET.
Figure 2:
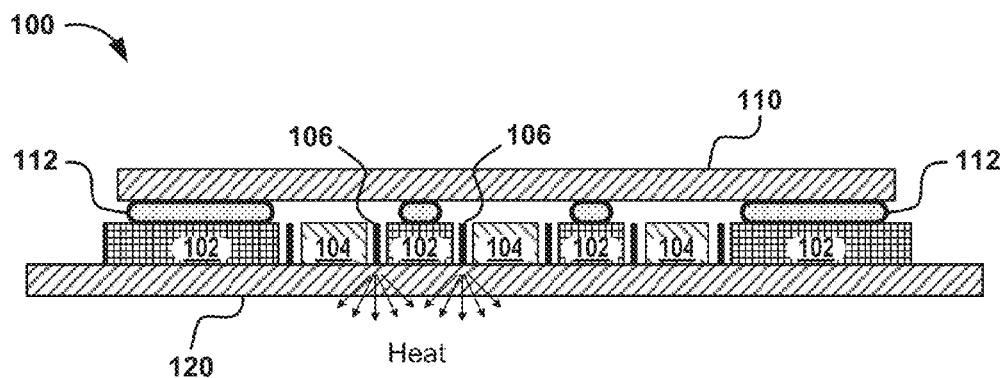
FIG. 2 is a cross section view of the FET of FIG. 1 along line a-a.

FIG. 1 shows a block diagram of a conventional layout for a prior art large periphery power FET 100. FIG. 2 is a cross section view of the FET 100 of FIG. 1 along line a-a. The FET 100 includes source fingers 102, drain fingers 104 and gate fingers 106. The source fingers 102 and drain fingers 104 may be ohmic metal fabricated on a N-type or P-type semiconductor 120, (or compound semiconductor epitaxial layer) which is disposed on a semi-insulating substrate (not illustrated) such as silicon or GaAs. According to additional embodiments, the compound semiconductor 120 may be fabricated from GaAs, GaN, GaAlAs, and GaAlInAs, although other materials that would be known to one of ordinary skill in the art are likewise contemplated for use in accordance with the present technology. The term ohmic metal is used to refer specifically to source metal, which is metal used in source fingers, and to drain metal, which is metal used in drain fingers. Source and drain metal may be in low resistance contact with the compound semiconductor epitaxial layer. This may be achieved by depositing a specific set of materials (e.g., Au, Ge, and/or Ni) then heating the wafer so that the metals alloy (or diffuse) into the epitaxial layer creating the low resistance connections. In some embodiments, gate metal, which is used in gate fingers comprises a set of deposited metals (e.g., Ti, Pt, Au, and/or Al). Gate metal forms a Schottky contact with the surface of the epitaxial layer, creating the Schottky diode structure in the region of epitaxial layer that comprises the gate region.

In operation, current flows between the source fingers 102 and the drain fingers 104. The amount of current flowing is controlled by a voltage applied to the gate fingers 106. The FET 100 further includes a drain bonding pad 114, source bonding pads 108, and a gate bonding pad 116. An air bridge 110 provides interconnections between the source fingers 102, through contacts 112 to the source fingers 102 and to the source bonding pads 108. The contacts 112 are shown in dotted line to indicate that they are between the air bridge 110 and the source fingers 102 or source bonding pads 108. A length of the source fingers 102, drain fingers 104, and gate fingers is measured in the horizontal axis as illustrated FIG. 1 and is generally the short dimension. A width of the source fingers 102, drain fingers 104, and gate fingers is measured in the vertical axis as illustrated FIG. 1 and is generally the long dimension. A "gate periphery" may be a measurement of an active area of a FET (or an active region of the FET under consideration). The gate periphery is generally a number of gate fingers distributed along the length of the device (the horizontal axis in FIG. 1) times the width of the gate fingers (in the long axis or vertical axis of FIG. 1). For example, a FET (or a region of a FET) that has 100 gate fingers, each 1 mm in width, has a gate periphery of 100 mm.

A device such as the FET 100 has a large footprint requiring a great deal of expensive wafer surface. This large die size is generally driven by a number of factors: The first factor is a requirement for many source and drain fingers 104 in the active area of the device to support a large gate periphery. The second factor is a requirement that the drain fingers 104 are large enough to conduct current without failing due to generating too much heat. The third factor is that the length of the source fingers 102 is driven by the process technology used to form the air bridge, thus, source fingers 102 must be large enough to accommodate the contacts 112 to the air bridge 110. The fourth factor is a requirement for large outboard bonding pads, e.g., the drain bonding pad 114, the source bonding pads 108, and the gate bonding pad 116.

FIG. 3 is a plan view illustrating a typical unit cell 310 of section 300 of active device area of the FET 100 of FIG. 1. The source fingers 102 and drain fingers 104 are 30 microns each in length and the channels 118 in which the gate fingers 106 are positioned are 5 microns in length. Thus, an example unit cell 310 of the device (represented by a dotted line rectangle) having a 70 micron length×100 micron width (7,000 sq. microns) would encompass two gates, each 100 microns wide, or 200 microns of gate periphery or "active" device area.

GaAs devices typically have a specific resistivity of around one ohm-mm, so in order to achieve on-state resistances in the milliohm range, very large FETs, with gate peripheries on the order of hundreds of millimeters, are required. This large gate periphery is the major yield driver (and major cost factor) in the manufacturing of such devices. Thus, a device as illustrated in FIG. 3 might require about 7,000,000 square microns (7 mm$^2$) of active device area, in addition to peripheral bonding pads to achieve 200 mm of gate periphery.

FIG. 4 illustrates a unit cell 410 of a section 400 of a reduced size for a compound semiconductor FET, in accordance with embodiments of the technology. The size of a compound semiconductor FET device may be reduced by reducing widths of the source fingers 402 and drain fingers 404 as illustrated in FIG. 4. For example, a source finger 402 and a drain finger 404, each having a length of about 7 microns may produce about three times the gate periphery in about the same size unit cell 410 (about 72×100 microns as illustrated in FIG. 4). Note that it may not be practical to shrink the length of the channel 118 in proportion to the unit cell because of various device performance restrictions such as breakdown voltage. Note also that because of the symmetrical nature of the ohmic metal structure of a FET, source and drain fingers may be interchangeable. The embodiment illustrated in FIG. 4 may achieve 600 mm of gate periphery in the unit cell 410 which is about same size as the unit cell 310.

As it turns out, there are a number of barriers to simply scaling a FET device such as illustrated in the section 300 of FIG. 3 down to a FET device as illustrated in the section 400 of FIG. 4. As discussed above, there is a limit to how much the length the drain fingers 104 can be reduced and still carry adequate current from the drain bonding pad 114 through the entire width of the drain fingers 104. As the cross section of source fingers 102 and the drain fingers 104 decreases metal migration occurs in the direction of the current, further decreasing the cross section. Further, as the cross section of the fingers decrease the resistance in the fingers increases. A practical limit for reduction of the length of the source fingers and the drain fingers 104 is about 30 microns.

Moreover, there are additional limits to simply scaling down various component parts of a FET device. For example, scaling down the length of the gate fingers 106 can result in an increase in defect rates due to breaks in the gate fingers 106. This in turn can reduce yield. It turns out that as the length of the gate fingers is reduced, the probability of a break in the gate fingers 106 increases. For example, a reduction in length of the gate fingers 106 to about 0.25-0.5 microns could substantially decrease a yield for a FET device having a 1 meter gate, to less than 40%. While, reducing the length of the gate fingers 106 may have limited bearing on the total size of a FET, there may be other reasons for wishing to decrease the length.

Another limit to scaling down a FET device turns out to be a limitation on spacing between gate fingers 106 (gate pitch) imposed by temperature control. Most of the heat is generated in the FET 100 and is generated under the gate fingers 106 and is conducted out of the device through the semiconductor 120 and the substrate. A compound semiconductor such as GaAs is a rather poor thermal conductor. The heat tends to propagate in a spreading action away from gate fingers 106 through the semiconductor 120 and substrate at about 45 degrees, as illustrated in FIG. 2. The heat spreading action tends to increase the area through which heat is removed from the gate region and improves efficiency for removing heat from the gate region. However, as the FET device is scaled down, heat propagating at 45 degrees from adjacent gate fingers 106 interferes with the spreading action, and efficiency of the conduction of heat through the semiconductor 120 and substrate decreases. Yet another barrier is that the air bridge 110 illustrated in FIG. 1 is precluded because of the narrow source fingers 402.

Figure 5B:
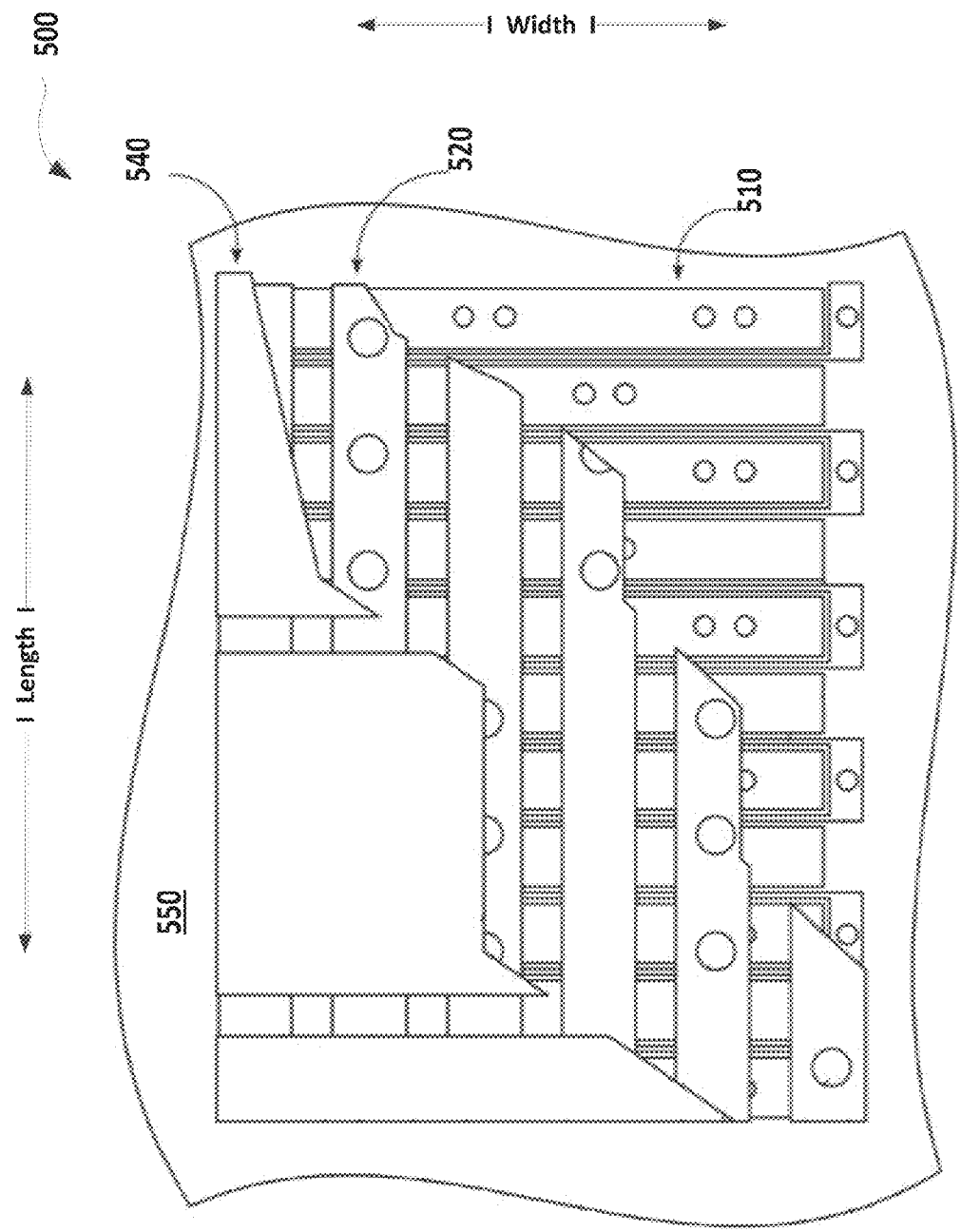
FIG. 5B is a top plan view of the cut-away of the FET device of FIG. 5A.
Figure 5C:
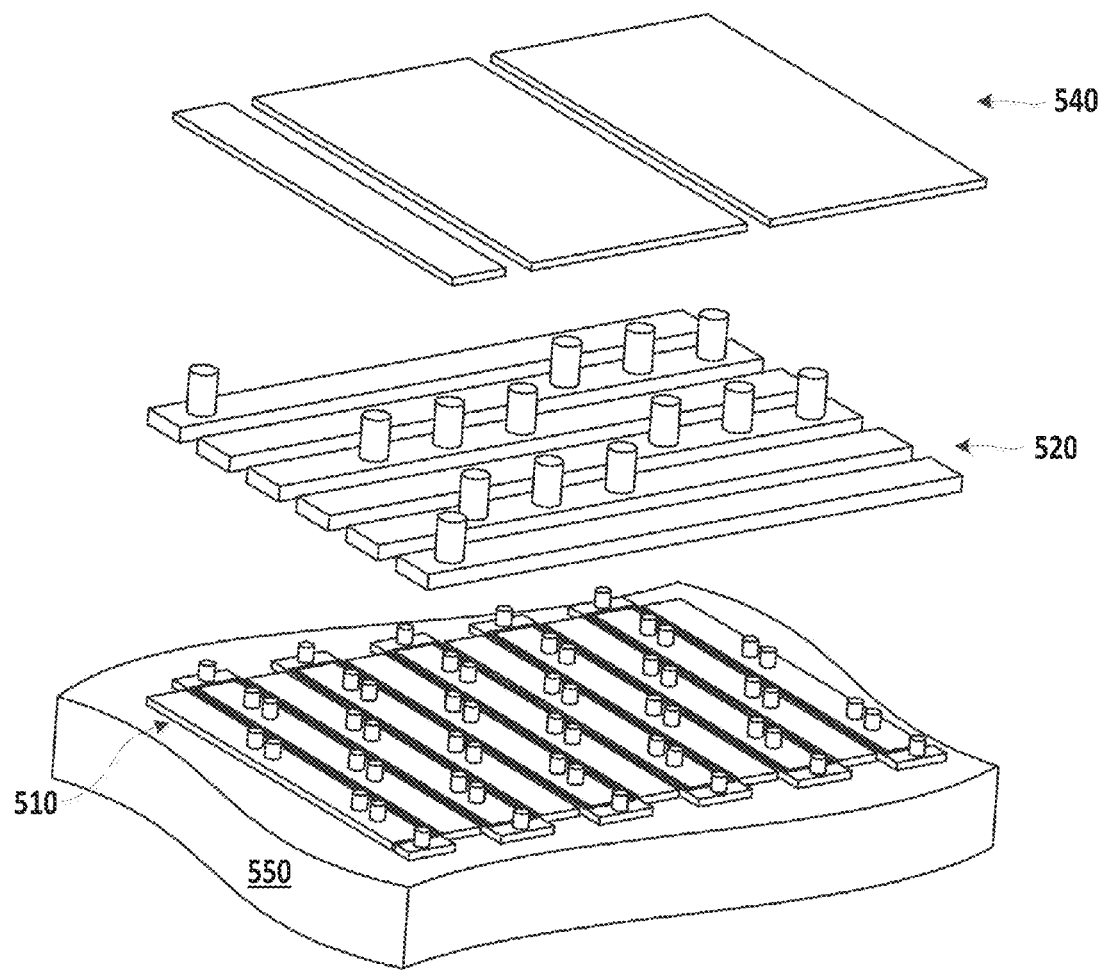
FIG. 5C is an exploded view without cutaway of the FET device of FIG. 5A.

FIG. 5A is a perspective cutaway view of a block diagram for a FET device 500 according to various aspects of the technology. FIG. 5B is a top plan view of the cut-away of the FET device 500 of FIG. 5A. FIG. 5C is an exploded view without cutaway of the FET device 500 of FIG. A. The arrangement of the components of the FET device 500 may provide a solution to a number of problems in scaling a compound semiconductor FET down to a smaller size. The FET device 500 includes a semiconductor layer 550 and an ohmic layer 510 disposed on the semiconductor layer 550. The semiconductor layer 550 may be a P-type or N-type semiconductor and may be fabricated using compound semiconductors such as GaAs and GaN. The semiconductor layer may be disposed on an insulating or semi-insulating substrate 560. Examples of an insulating substrate layer include GaAs, Si-carbide, Si, and sapphire. During fabrication the insulating substrate layer may be ground down to 50-100 microns. The FET device 500 further includes a first dielectric layer 528 disposed on the ohmic layer 510, and a first metal layer 520 disposed on the first dielectric layer 528. The FET device 500 further includes a second dielectric layer 538 disposed on the first metal layer and a second metal layer 540 disposed on the second dielectric layer. The first dielectric layer 528 may cover a substantial portion or the entire surface of the FET device 500, including ohmic metal, gate metal and the exposed surface of the epitaxial layer between the gate metal and the ohmic metal. The first dielectric layer 528 may seal the covered surface and/or any embedded structures (e.g., vias) from the outside environment, protecting against accidental damage and exposure to microscopic particles. This, in turn, may eliminate the need for an external package which is often required to achieve such a level of environmental protection. Similarly, the second dielectric layer 538 may cover, seal, and/or protect the second metal layer 540. The first dielectric layer 528 and/or the second dielectric layer 538 may hermetically seal the device surface. In various embodiments, the first and second dielectric material includes silicon dioxide, silicon oxide, fluorine-doped silicon dioxide, carbon-doped silicon dioxide, porous silicon dioxide, porous carbon-doped silicon dioxide, and/or the like. The first dielectric layer 528 and second dielectric layer 538 are omitted in FIG. 5B for clarity.

Figure 6:
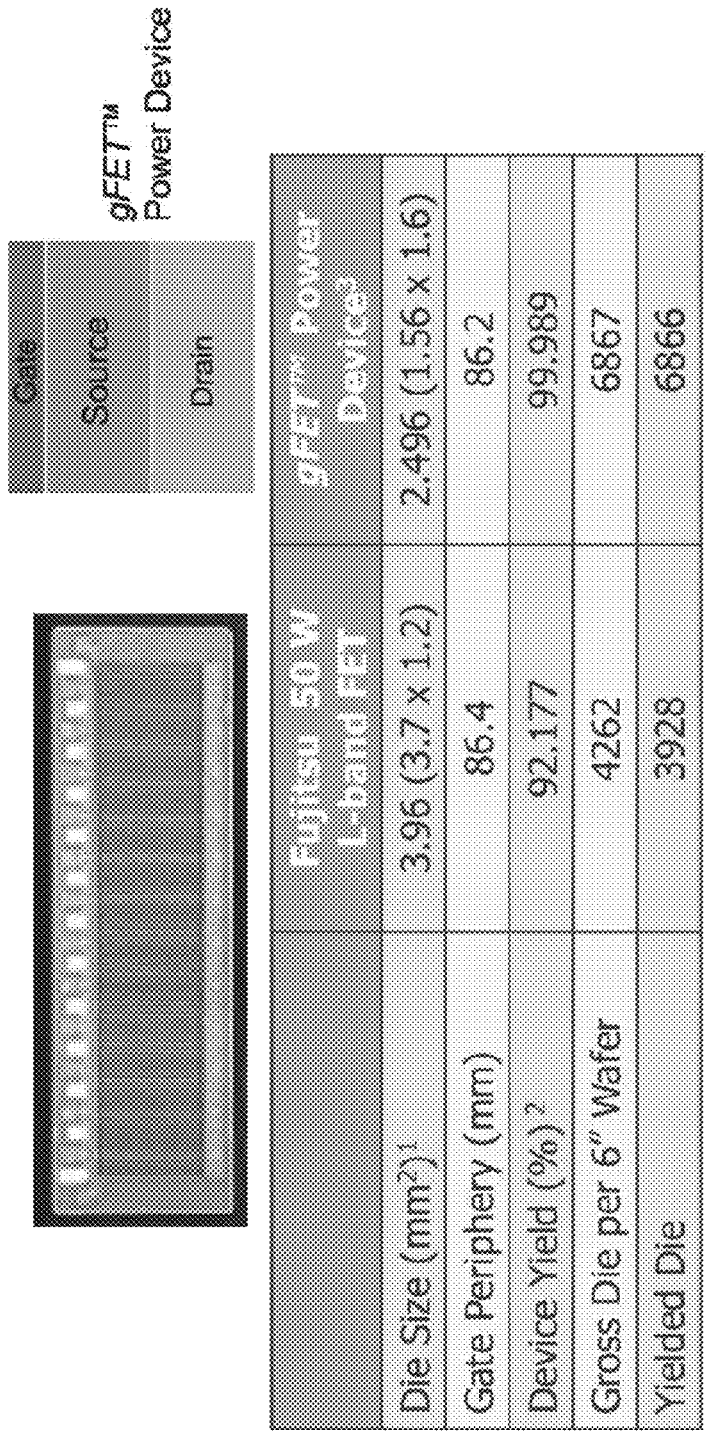
FIG. 6 comprises a side-by-side comparison between a conventional GaAs power FET (Fujitsu 50 W L-band FET) and the FET device of FIG. 3A, as well as a data comparison table.

FIG. 6 illustrates some advantages of the new gFET device when compared to a commercial 50-W L-band power FET. As can be seen in the table comparison, the gFET is approximately 37% smaller than the conventional L-band power FET. Additionally, there is a corresponding increase in the gross die per six inch wafer, and an even more significant increase (75%) in the yielded die per six inch wafer due to the compounding effect of smaller die size and higher die yield.

Figure 7:
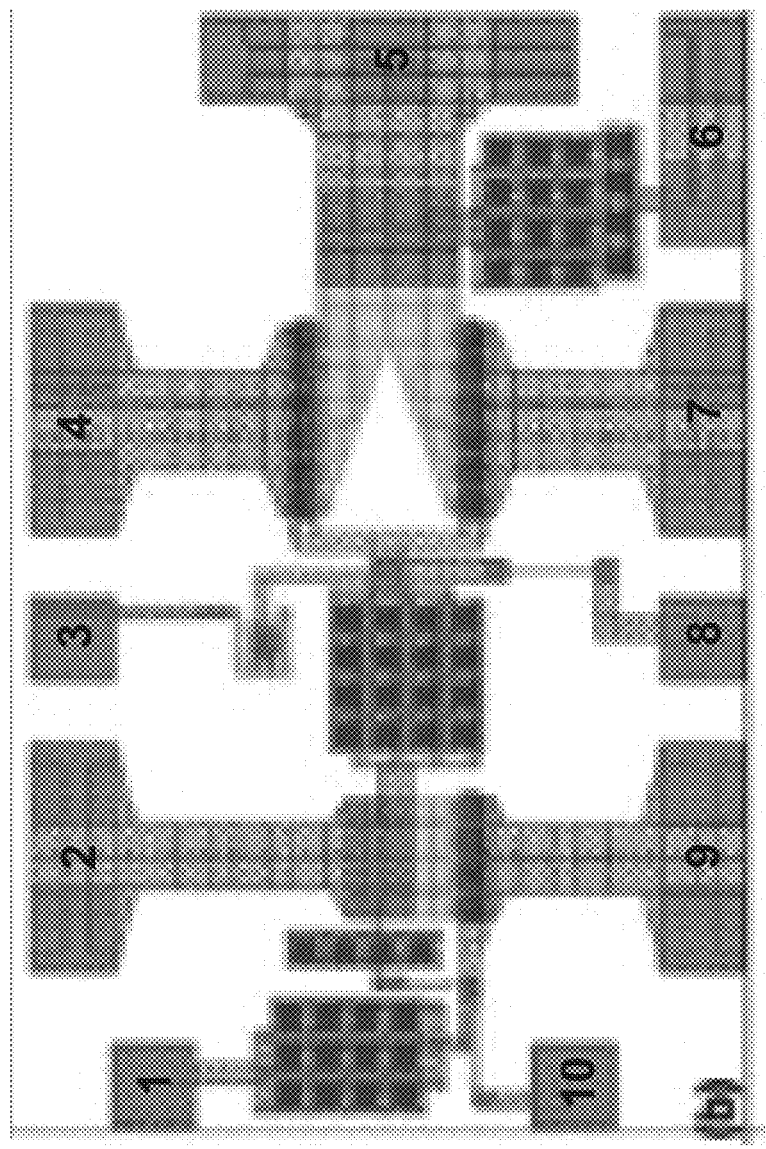
FIG. 7 is a schematic diagram of a conventional monolithic microwave integrated circuit ("MMIC").

FIG. 7 is a schematic diagram of a conventional monolithic microwave integrated circuit ("MMIC"). A MMIC essentially integrates, on the same die, one or more microwave devices (frequently FETs but not always) along with the circuitry necessary to make them operate over a specific frequency range for a particular function (such as power amplification). Typically, the devices themselves take up only a small fraction of the chip's surface area. The rest is consumed by the circuitry (transmission lines, capacitors and sometimes inductors) and the bonding pads needed to connect to the outside world for signal inputs and outputs and bias voltages. The MMIC of FIG. 7 is a 2.4 GHz CMOS low power (100 mW) amplifier, which may be found in a cell phone. The MMIC has an overall size of 1.1×0.7 mm and comprises ten bonding pads arrayed around the periphery of the device.

Figure 8A:
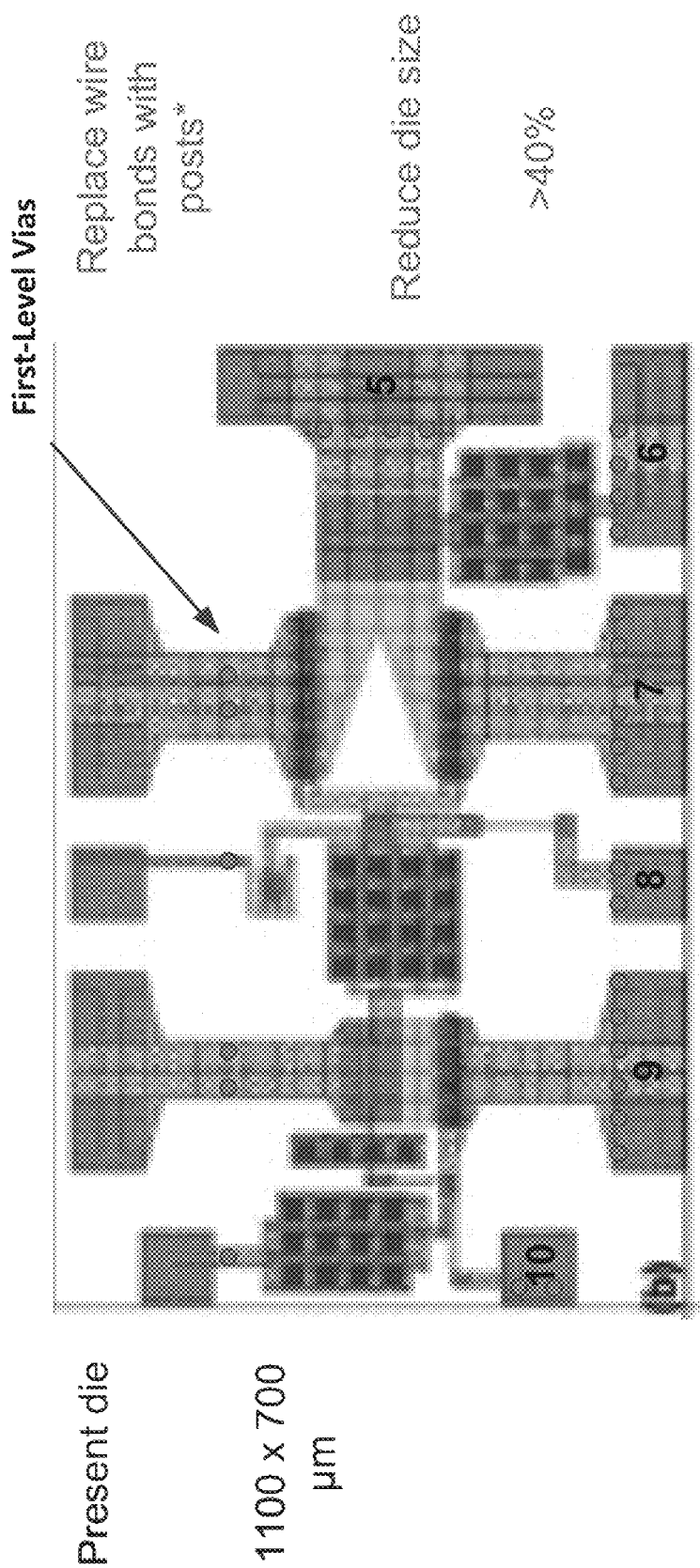
FIG. 8A illustrates a process for reducing the size of the conventional MMIC of FIG. 7 by positioning first level vias above the active area of MMIC device.

FIG. 8A illustrates a portion of a process for creating a gFET MMIC having a reduced size relative to the conventional MMIC of FIG. 7. Rather than having the pads on the periphery of the device, moving the pads above the active area of the device using the aforementioned gFET design, the die size for the gFET MMIC can be dramatically reduced and, along with it, the MMIC's cost. FIG. 8A illustrates the positioning of the first-level vias on the MMIC device. Note that the vias shown in the figure are approximately 30 times actual size. Therefore, it will be understood that multiple vias may exist on even the narrowest lines in the circuit layout.

Figure 8B:
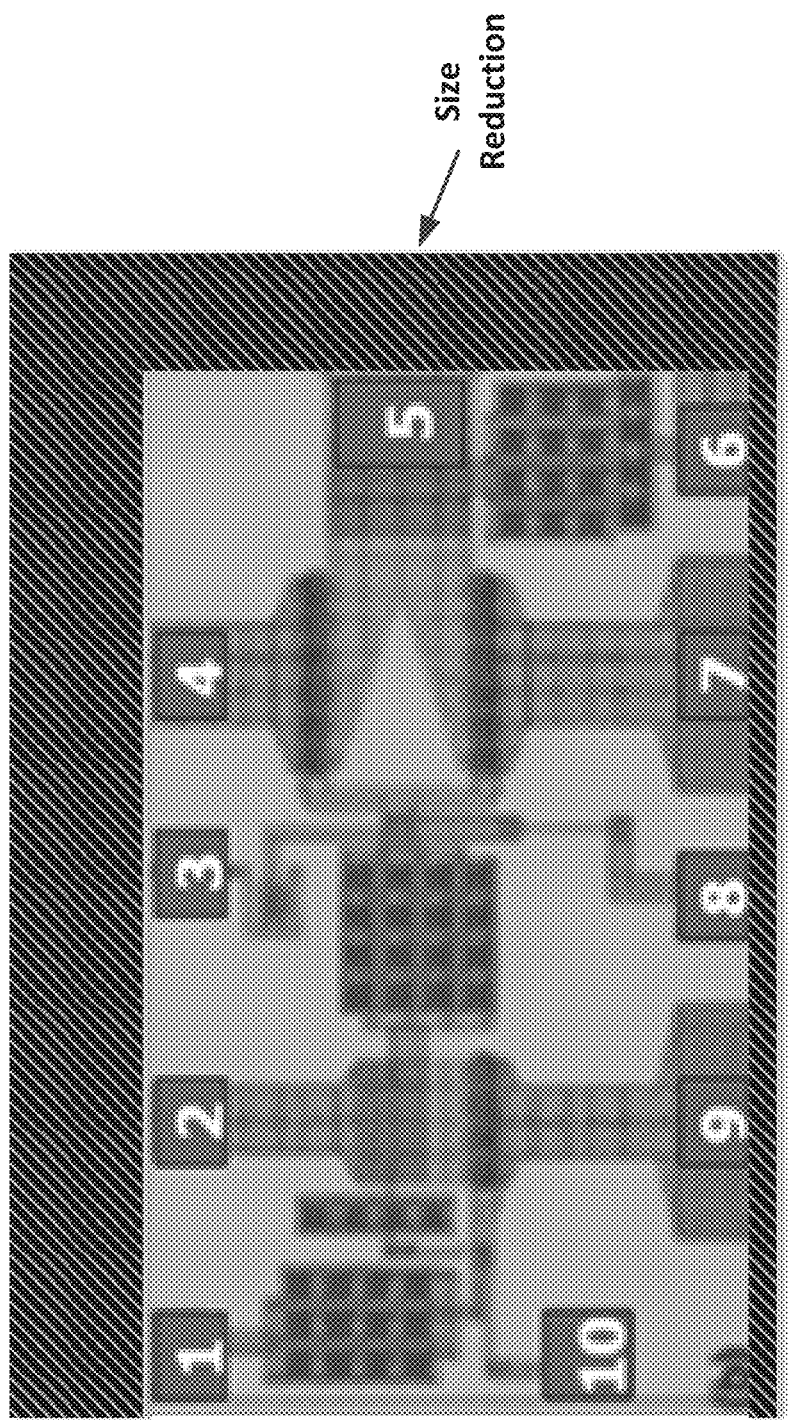
FIG. 8B illustrates a completed MMIC die having new bond pads and an overall reduced die size.

FIG. 8B shows the new bonding pads (number from 1-10) on the finished device as well as the die area that has been eliminated (shown in black background with white hashing). In this case, the die size was reduced by approximately 30% without making any adjustments to the original circuit layout. In addition, by bumping the bonding pads and flip mounting the chip directly to the next level circuit board, additional area on the circuit board would be save as well.

Dual Power Devices

Figure 9:
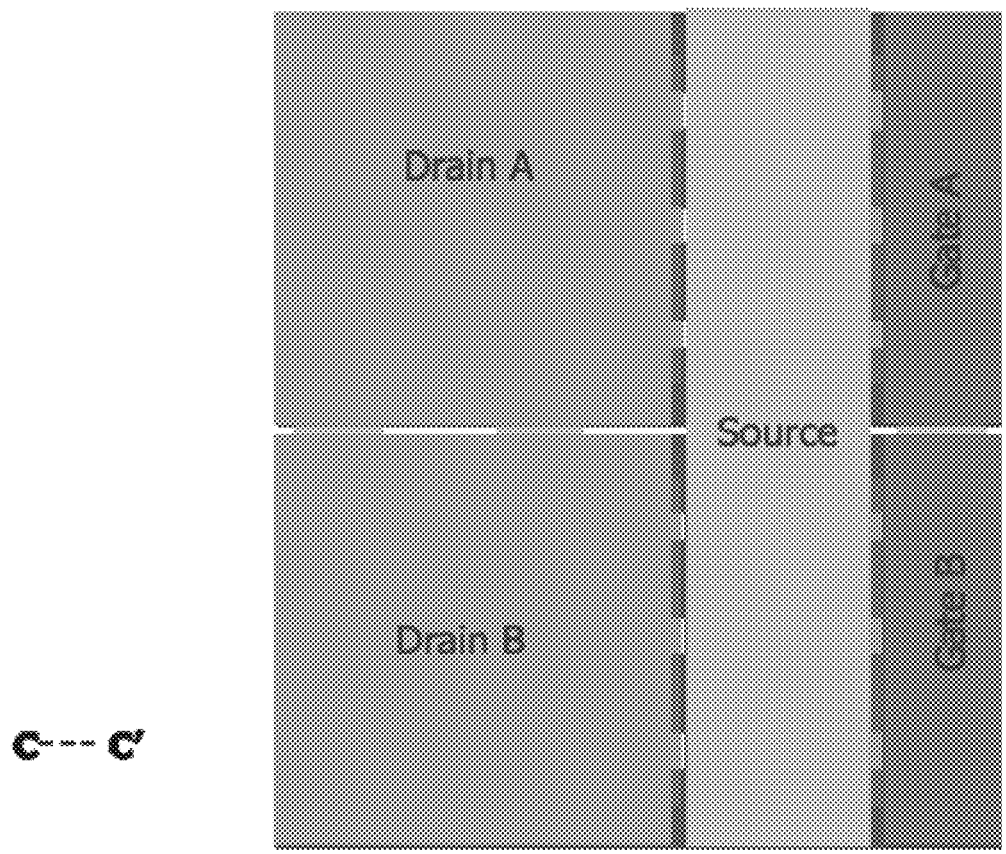
FIG. 9 is a top down view of a dual power device constructed in accordance with the present technology.
Figure 10:
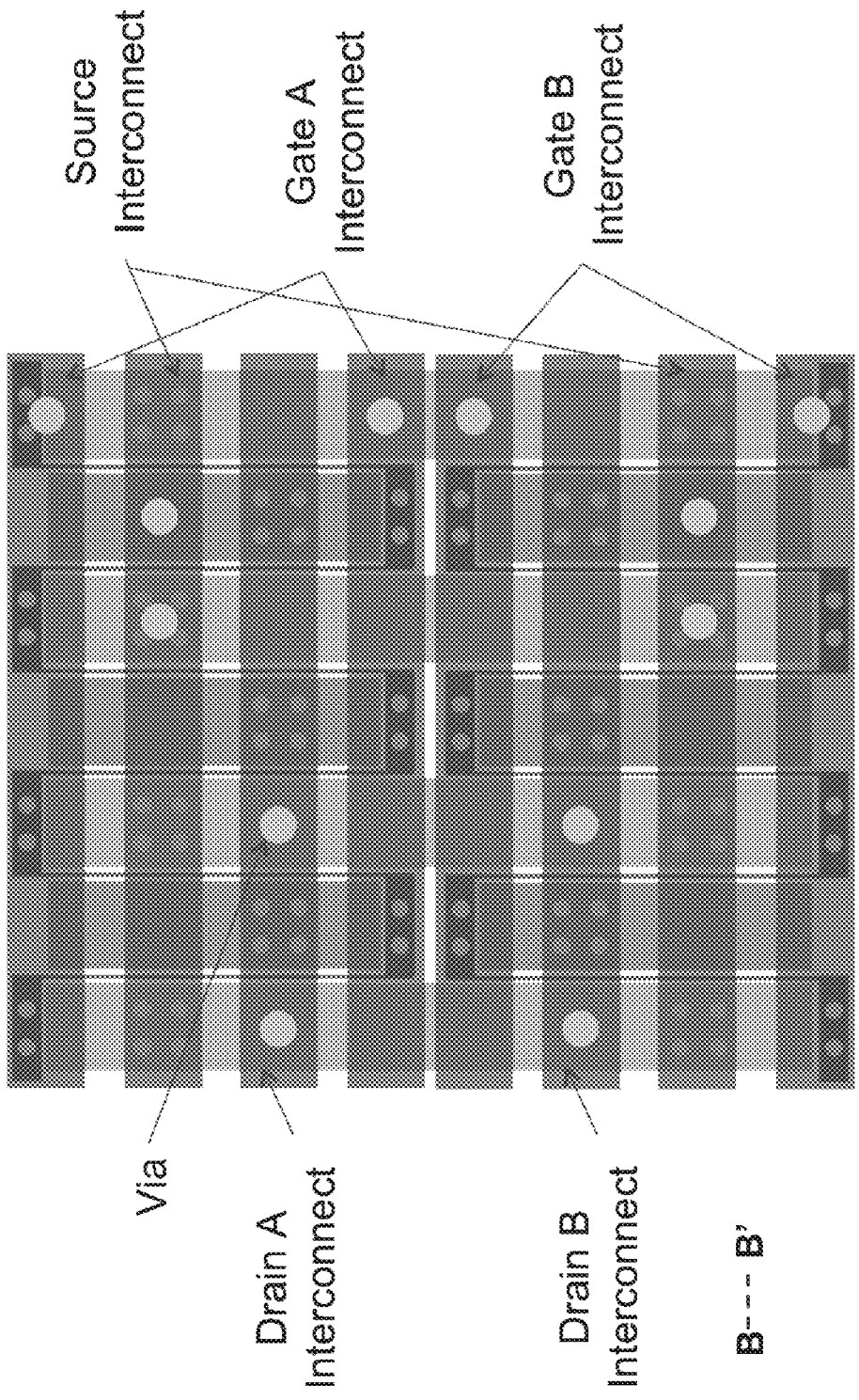
FIG. 10 illustrates two FET devices for use with in the dual power device of FIG. 9.

FIGS. 9 and 10 collectively illustrate a dual power device that incorporates two of the gFET devices described above. As background, in RF and microwave power amplifiers, the output stage of the amplifier invariably consists of a pair of power devices operating in parallel. These parallel devices maximize the efficiency of the amplifier while maintaining good linearity and minimizing the loss in the signal that is fed from the amplifier to the antenna. In some applications where only very low output power is required, only one device may be employed.

The two devices may have separate inputs and outputs but a common ground. Additionally, to obtain the best performance characteristics from the power amplifier, the two devices should be as much like each other electrically as possible. Achieving these goals is difficult but absolutely key to the amplifier's performance.

The amplifier circuit relies on the signals coming separately from the two devices to be identical so that when they are ultimately combined (before they get to the antenna) their amplitudes and phases are exactly matched. Any mismatch in these parameters results in imperfect combining and lower performance. To assure a good match the devices are normally separately tested in some fashion then paired up according to the results. This is a time consuming, expensive and inexact exercise.

The differences between devices come from natural local variations across the original wafer due to subtle material differences and/or subtle local fluctuations in the effects of various process steps. While any one factor may have an overall variation of less than one percent when you consider the literally hundreds of elements that go into making a semiconductor device the random combination of these factors can cause significant variability in electrical parameters from one part of the wafer to the other.

Regarding the common ground, if the two devices are physically separated from each other (as they must be since they are normally in individual packages) slight differences in the ground potential seen by the two devices are very common. Such differences can lead to so-called ground loops. This condition can very easily cause the circuit to oscillate, which not only renders it useless as an amplifier, it can also destroy one or both devices.

FIG. 10 illustrates a cutaway view of the B-B' plane of a gFET device that consists of a side-by-side pair of power devices. It is note worthy that B-B' is a cutaway view of the gFET device taken between the first and last metal layers. FIG. 9 shows the top view of the finished device. Note that the gFET device has the requisite separate drain and gate inputs and common source needed for the output stage of a power amplifier, but they are integrated onto one die. Moreover, the electrical terminals are on one surface (upper pad surface) for easy flip-mounting. Also note that the common source is integral to, and distributed throughout, the basic device structure. Advantageously, this provides for an ultra-low resistance and inductance connection between the sources of the two devices, substantially reducing or completely eliminating the possibility of ground loops. In addition, the two devices are, by definition, nearest neighbors on the wafer, increasing the likelihood that the devices will be as well matched electrically as possible to one another.

Multi-Port Power Devices

Another feature of RF and microwave power amplifiers is multi-stage matching networks to the input and output of the devices. Large power FETs have low impedances (on the order of a few ohms) particularly at the output. These impedances are typically matched to 50 ohms to connect efficiently to the outside world. The lower the starting impedance at the device terminal the harder it is to do this matching without losing significant power. Often, particularly at higher frequencies, to make this matching easier and thus less lossy the device is segmented into smaller, parallel pieces each with a higher impedance. These segments are then partially matched and combined with the signal from the neighbor piece. The combination is then matched and combined with its neighbor pair and so on in a reverse branching fashion.

Figure 11:
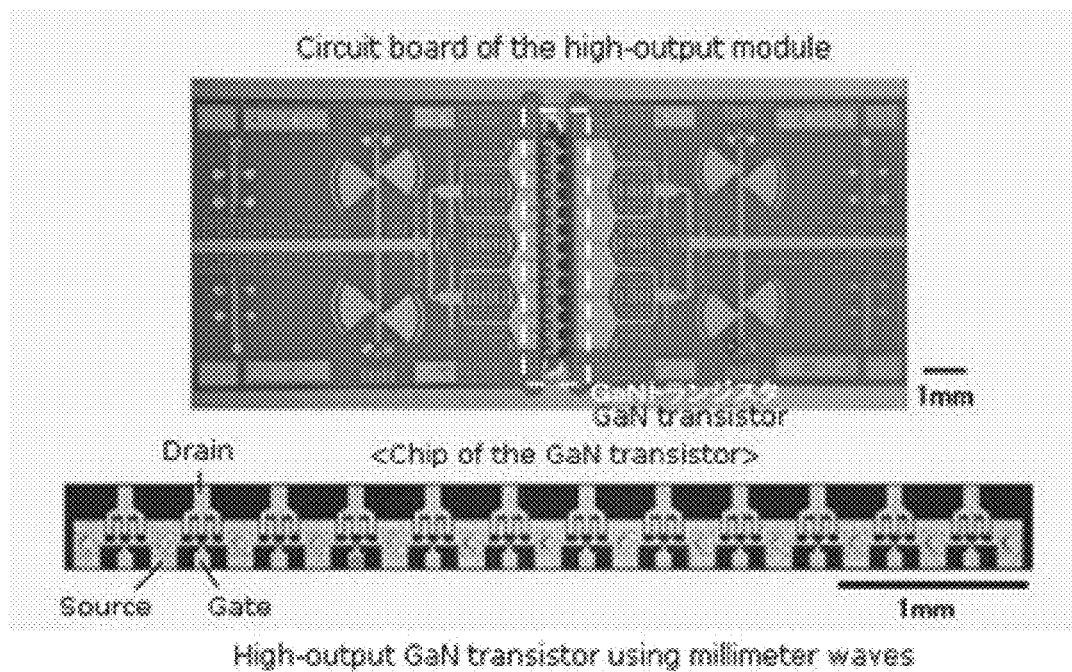
FIG. 11 illustrates a conventional high-output GaN transistor (Panasonic Ka-Band power FET and matching networks) that uses millimeter waves.

FIG. 11 shows an example of such a device and its matching networks. More specifically, FIG. 11 illustrates a conventional high-output GaN transistor Panasonic Ka-Band power FET and its matching networks. Note that the FET device itself is segmented into 12 cells, each with its own drain and gate pad. In the matching network, each device includes a group of three cells that are matched and combined with the matched output from its adjacent group of three cells. The signal from the two groups of six cells is matched and combined together then the final matching is done to the output of the circuit. The reverse is done on the input side, where the input signal is first impedance matched down from 50 ohms to a lower value. It is then split in two to feed separate halves of the device and further matched to a yet lower impedance. A final splitting results in four parallel signals that are separately matched to the input impedance corresponding to the group of three cells that each feeds. Notice also that the segmenting of the device into 12 separate cells leads to a large die with a highly undesirable aspect ratio.

Figure 12:
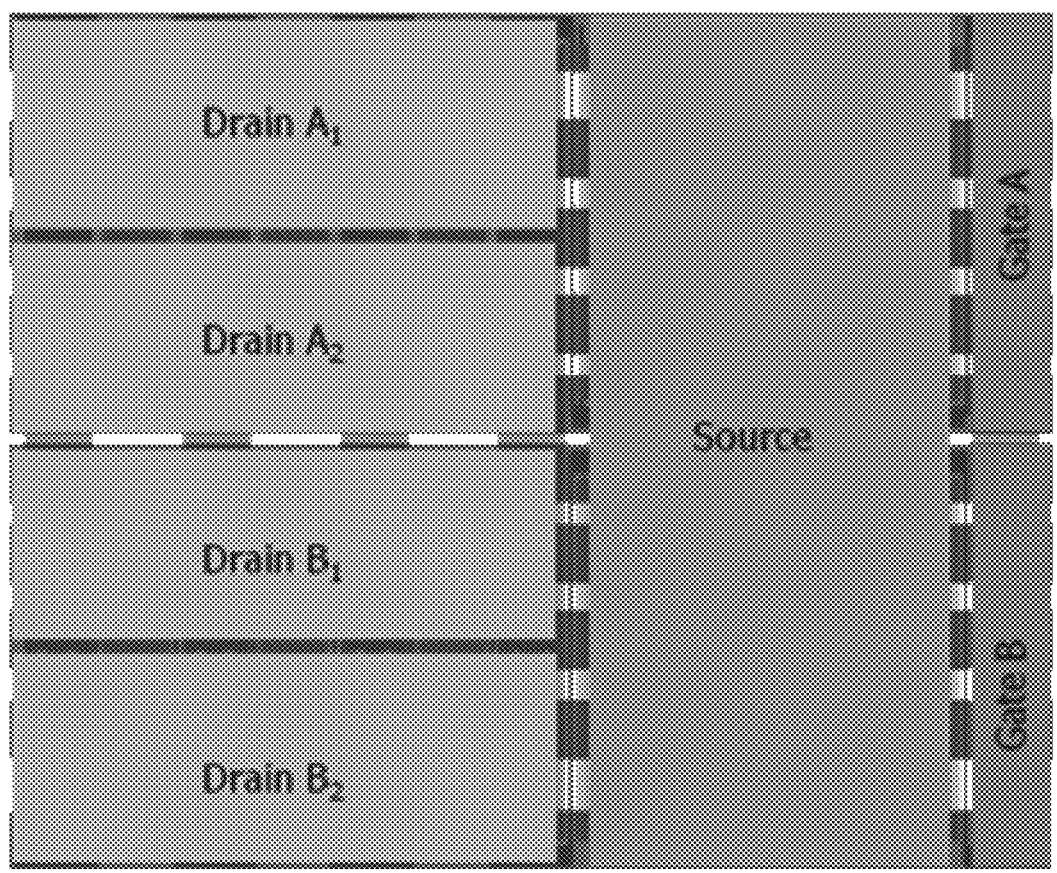
FIG. 12 illustrates an exemplary multi-port power device constructed in accordance with the present technology.
Figure 13:
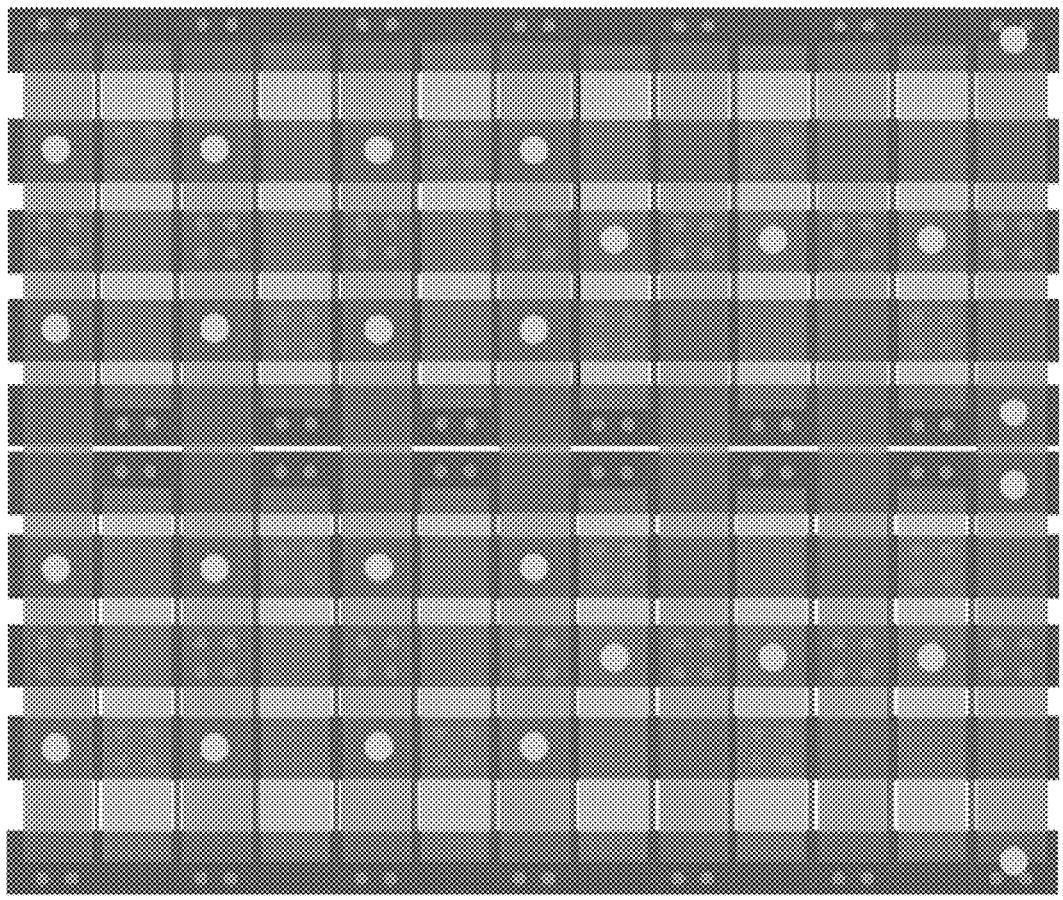
FIG. 13 is a cutaway view of vias between first and last metal layers of the multi-port power device of FIG. 12.

FIGS. 12 and 13 illustrate an exemplary multi-port power device ("MPPD") constructed in accordance with the present technology. FIG. 13 specifically illustrates a cutaway view of vias between first and last metal layers of the multi-port power device of FIG. 12.

Note that the MPPD is segmented into cells with each cell having its own output port (drain pad) and each pair of cells having its own input port (gate pad). Also note that the MPPD structure is essentially identical to the dual device described in greater detail with regard to FIGS. 9 and 10, except that the last metal layer (pad layer) has been changed to provide for multiple drain pads.

FIG. 14 comprises a side-by-side comparison between the conventional high-output GaN transistor of FIG. 11 and the exemplary multi-port power device of FIG. 12, as well as a data comparison table. Note in particular the drastically reduced aspect ratio which makes handling and mounting the chip much easier with much higher yield.

Dual-Gate Power Devices

Figure 15:
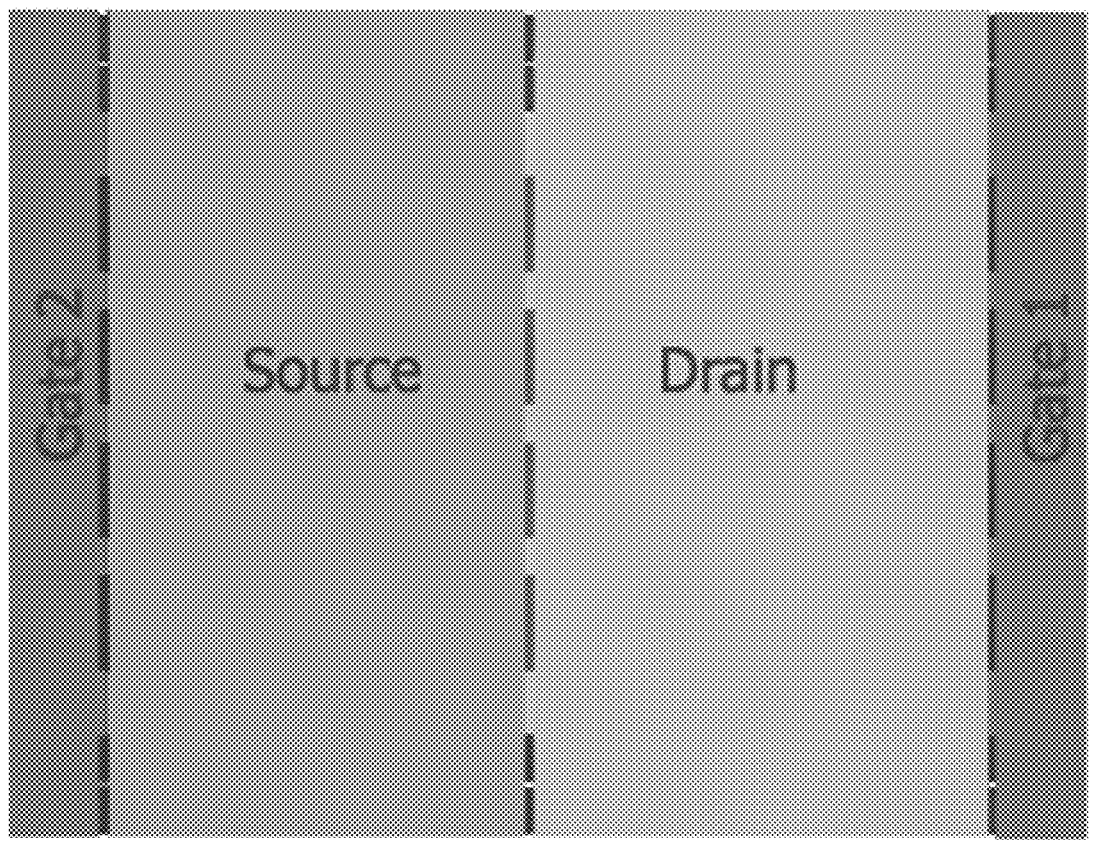
FIG. 15 is a top down view of an exemplary dual gate power device.
Figure 16A:
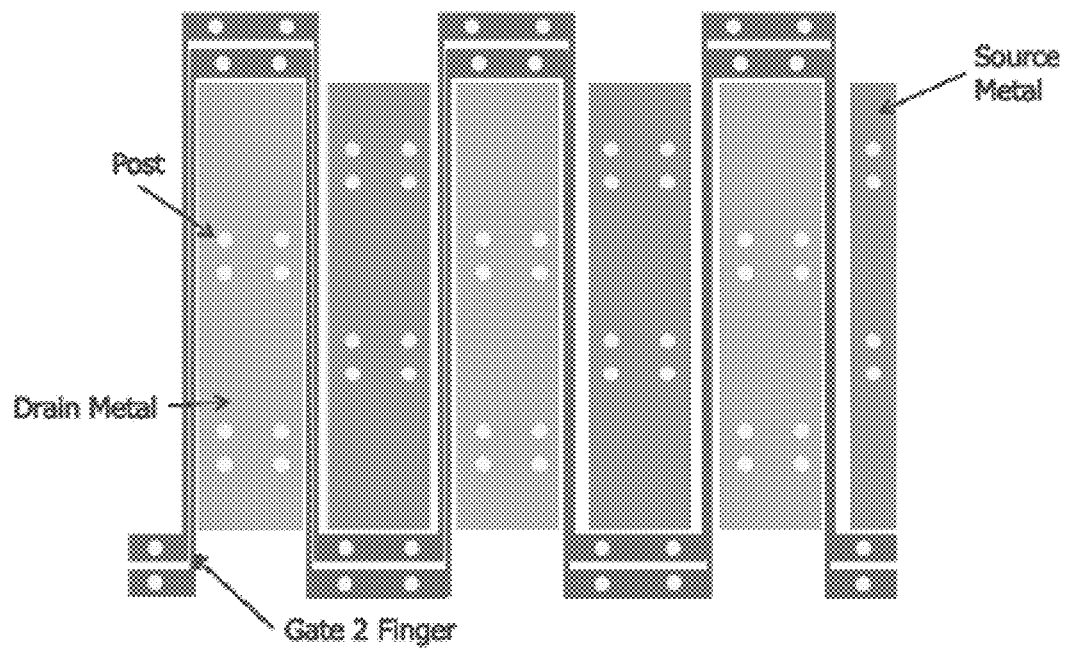
FIG. 16A is a cutaway view of vias between the ohmic layer and the first metal layer of the dual-gate power device of FIG. 15.
Figure 16B:
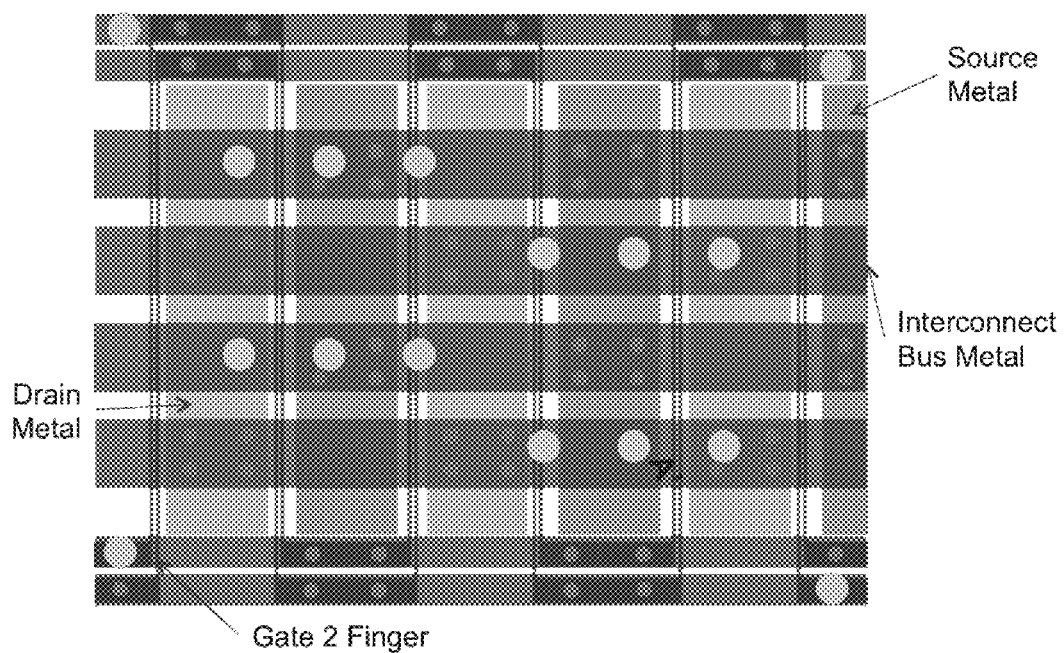
FIG. 16B is a cutaway view of vias between first and last metal layers of the dual-gate power device of FIG. 15.

FIGS. 15-16B collectively illustrate an exemplary dual-gate power device ("DGPD"). Specifically, FIGS. 16A-B are cutaway views of vias between first and last metal layers of the DGPD. A variation on the basic power FET is the dual-gate power FET, or DGPD. The DGPD is characterized by a second gate finger (Gate 2 Finger) segment in each channel, which may be controlled by a separate input connection. The DGPD has significantly higher gain than a single-gate FET and substantially better reverse isolation which helps make the DGPD more stable (e.g., substantially resistant to oscillation). Advantageously, the second gate can be used to toggle the device rapidly on and off which is useful in some modes of amplification. DGPD constructed with gFET devices of the present technology have a relatively small footprint as well as the advantages of the gFET device previously described.

Cascode Amplifiers

Figure 17:
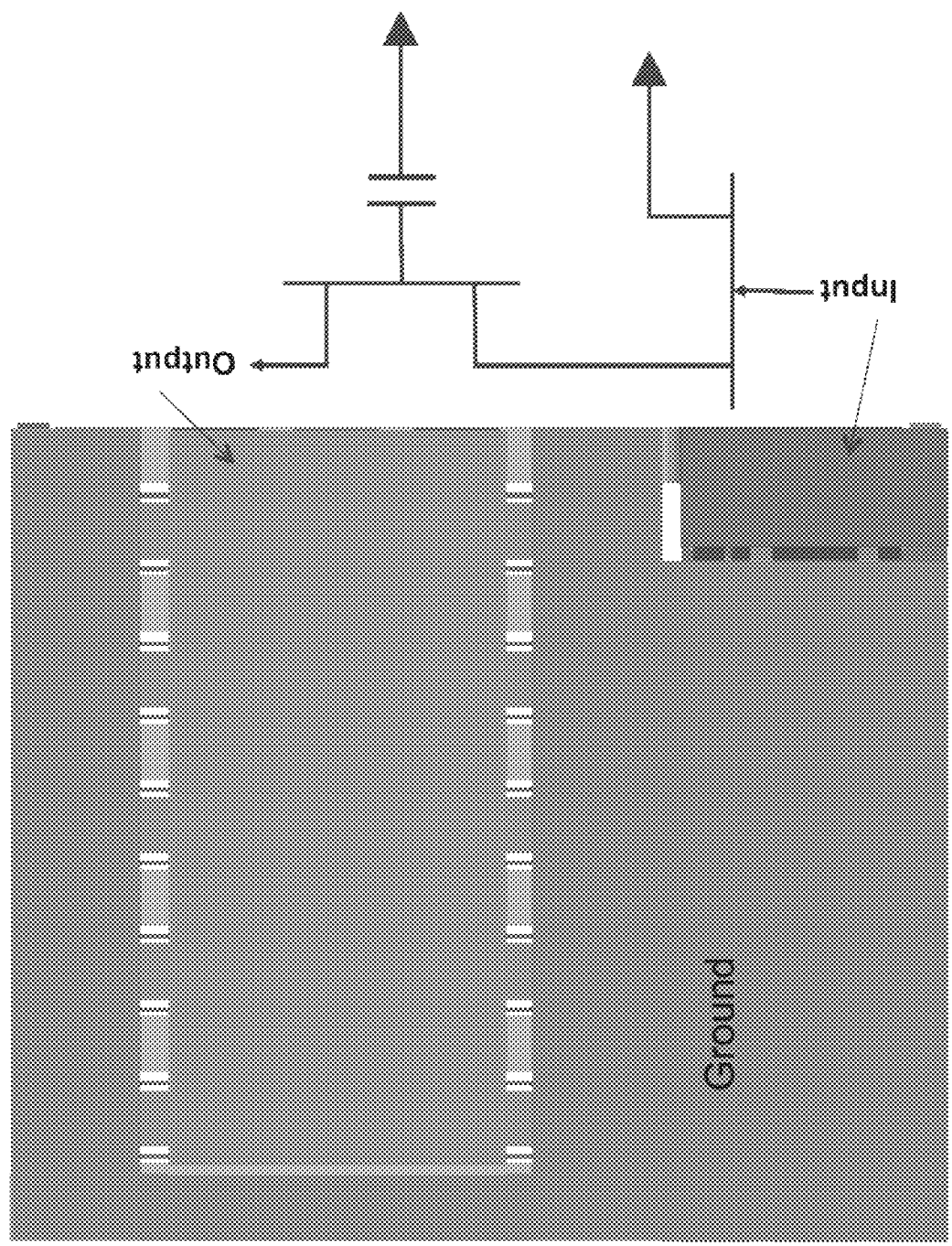
FIG. 17 is a top down view of an exemplary cascode amplifier device constructed in accordance with the present technology, as well as a circuit diagram of a cascode amplifier.
Figure 18:
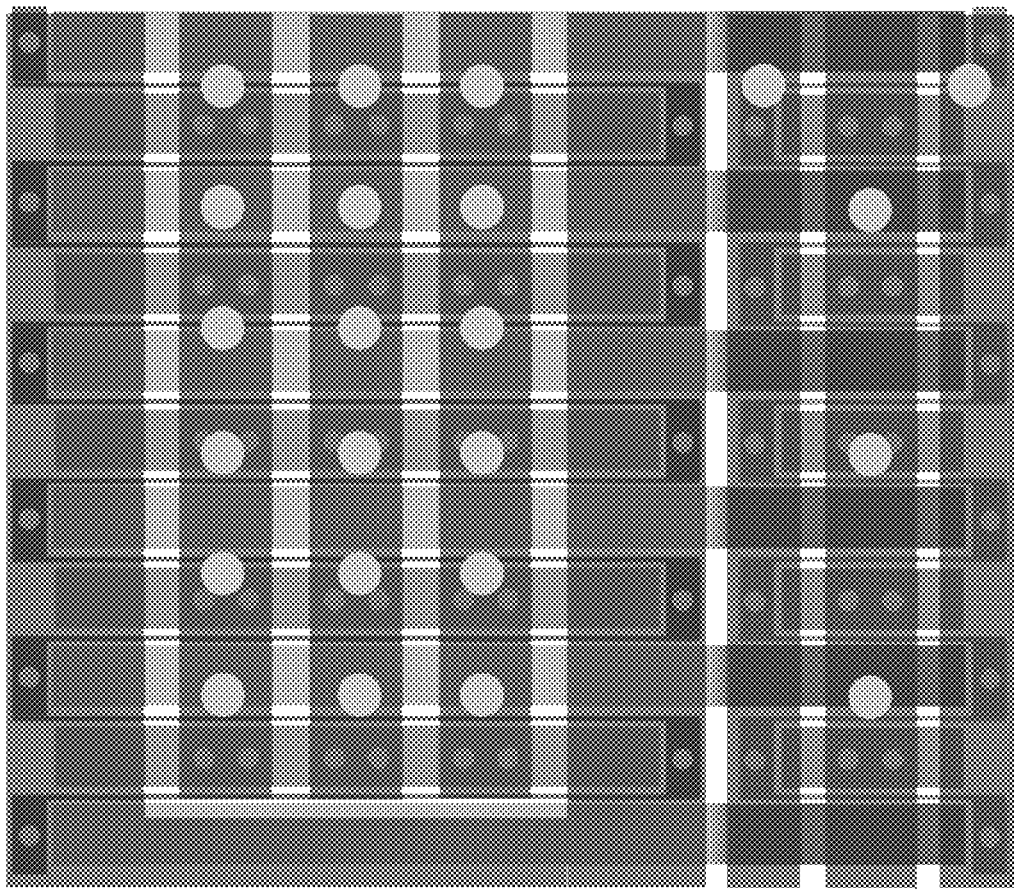
FIG. 18 is a cutaway view of vias between first and last metal layers of the cascode amplifier of FIG. 17.

Yet another variation of microwave devices can be realized using the gFET device design. FIG. 17 is a top down view of an exemplary cascode amplifier device constructed in accordance with the present technology, as well as a circuit diagram of a cascode amplifier. FIG. 18 is a cutaway view of vias between first and last metal layers (pad layer) of the multi-port power device of FIG. 17.

Gallium Nitride ("GaN") Devices

As mentioned briefly above, in addition to GaAs, microwave power devices can be fabricated on other compound semiconductor materials, one of which is gallium nitride. GaN has been shown to have significantly improved performance characteristics when compared with GaAs for very high power and/or high voltage applications. With GaN material it is possible to produce power FETs with higher power density (watts of output power per unit of gate periphery), better linearity, higher power added efficiency, etc. However, unlike GaAs there is no native GaN substrate material so the devices must be processed on epitaxial layers grown on some other substrate material, most typically silicon carbide ("SiC"). The problem is that SiC substrates are presently only available in three inch diameter and at a cost that is several times higher than a corresponding GaAs substrate. This makes the GaN devices fabricated on such wafers quite expensive compared with the above mentioned GaAs-based ones.

Alternatively, it is possible to grow GaN material on silicon substrates, which are much cheaper and are readily available in sizes of four and six inches, and potentially even larger. However, silicon is a very poor thermal conductor when compared to SiC, which directly impacts the size and performance of GaN devices fabricated on silicon substrates. The standard interdigitated device structure (multiple parallel interconnected transistors) must be spread out in order to avoid thermal coupling from each transistor to its neighbors as the heat transits from the surface through the substrate to the back of the chip where it is attached to the heat sink. This spreading reduces performance and increases the die size thus reducing the number of die that can be generated per wafer, which negatively impacts cost.

The design structure for the power gFET device of the present technology alleviates these thermal problems. The GaN epitaxial wafer can be grown on an inexpensive silicon substrate. The GaN device itself and the interconnect structure can them be fabricated creating a GaN power device.

In this configuration the heat (which originates in the channel regions in the GaN device) may flow not through the silicon substrate on which the GaN epitaxial wafer was grown but rather through the interconnect network. This is a relatively short, all-metal path that has a low thermal resistance. In addition, the GaN power device enjoys all the other benefits (described above) of being a small, low-cost, chip-scale package transistor as is the GaAs gFET power device. Thus, all of the variations of GaAs-based microwave devices previously described can also be realized in exactly the same fashion with GaN as the underlying semiconductor material.

Single-Pole Double-Throw RF Switches

Figure 19:
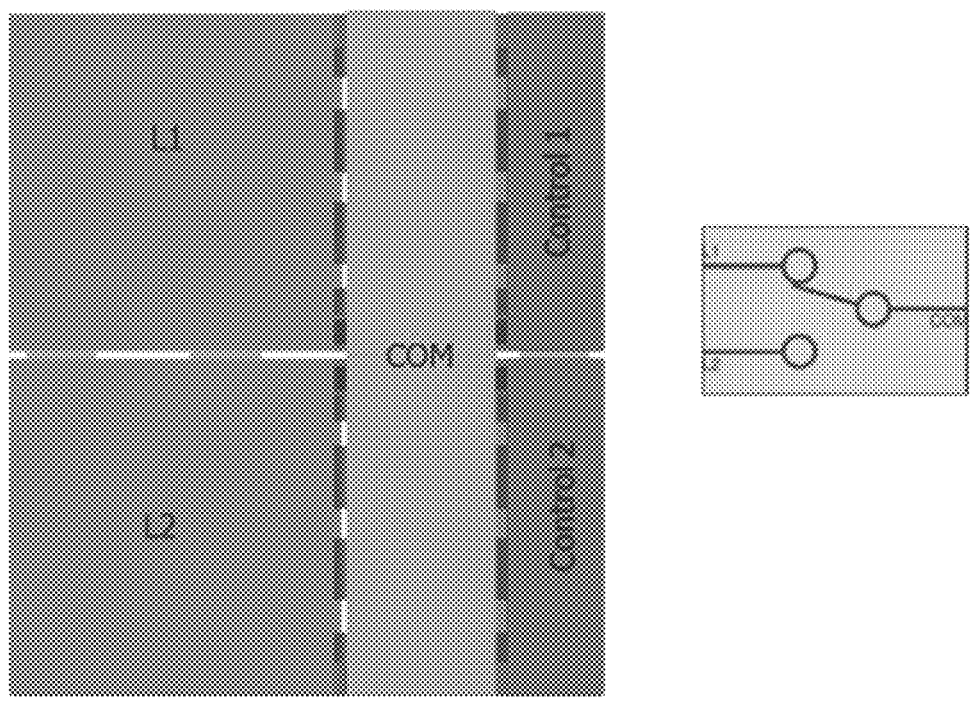
FIG. 19 is a top down view of an exemplary single-pole, double-throw RF switch, constructed in accordance with the present disclosure, as well as a circuit diagram for a single-pole, double-throw RF switch.

FIG. 19 is a top down view of an exemplary single-pole, double-throw RF switch, constructed in accordance with the present disclosure, as well as a circuit diagram for a single-pole, double-throw RF switch. More specifically, single-pole, double-throw switches are important elements in transmit/receive (T/R) modules. These RF switches route the incoming signal from the antenna to the low-noise receiver amplifier, or the outgoing signal from the transmitter power amplifier to the antenna. At the other end of the module a similar RF switch connects the baseband processor to the transmit leg, or to the incoming RF signal after it has been amplified. In both cases what is required is a switch that can control and connect RF signals at low loss. Configured appropriately, the Dual Power Device described in greater detail with reference to FIGS. 9 and 10 can serve as such a switch.

The device shown in FIG. 19 is substantially identical to the aforementioned Dual Power Device. The common switch terminal (labeled COM) is the single pole. By biasing the gate labeled Control 1 to a voltage above pinch-off, an RF path is created between the COM terminal and the L1 terminal, provided that the gate labeled Control 2 is biased below pinch-off thus closing the channel on the L2 side of the device. Because of the bi-directional nature of the compound semiconductor gFET device the RF signal can traverse through the switch equally well in either direction. By reversing the control signals, an identical RF path can be established between the COM and L2 terminals instead.

Because the gFET device design enables devices with large gate periphery (and thus very low channel resistance) to be easily and inexpensively manufactured, this device would have lower RF losses and would be smaller and cheaper than conventional RF switches.

Single-Pole and/or Multi-Pole Multi-Throw

Figure 20:
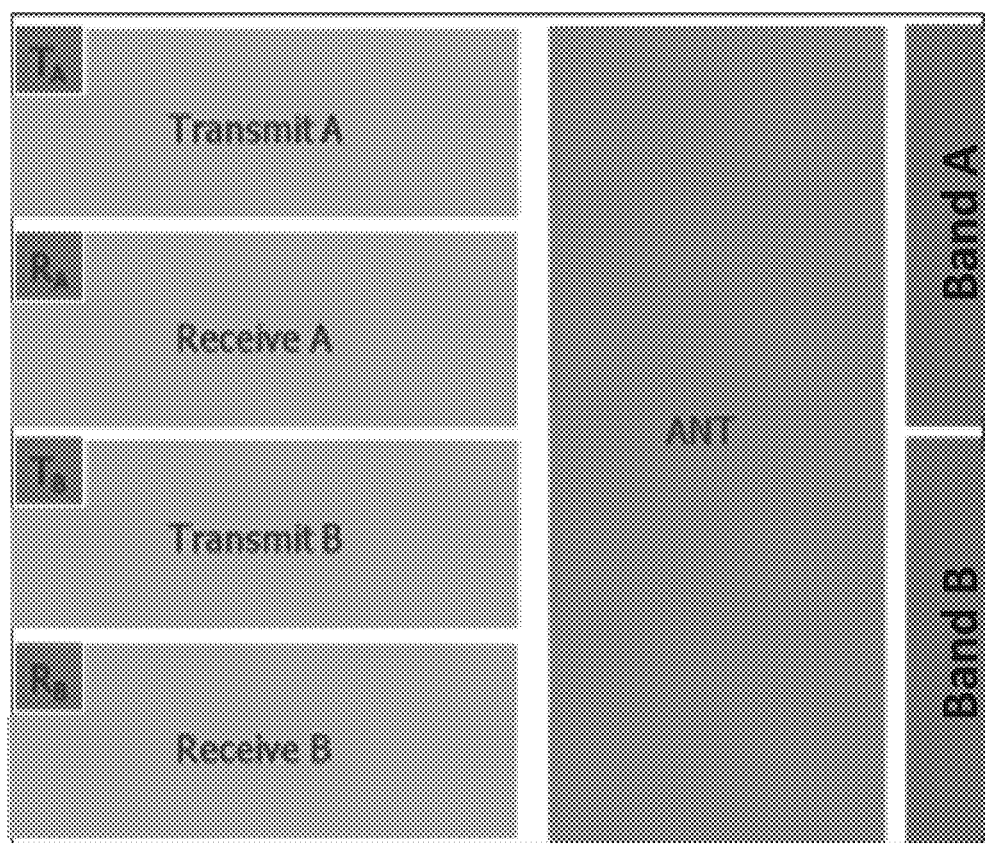
FIG. 20 is a top down view of an exemplary single-pole, four throw RF switch, constructed in accordance with the present technology.
Figure 21:
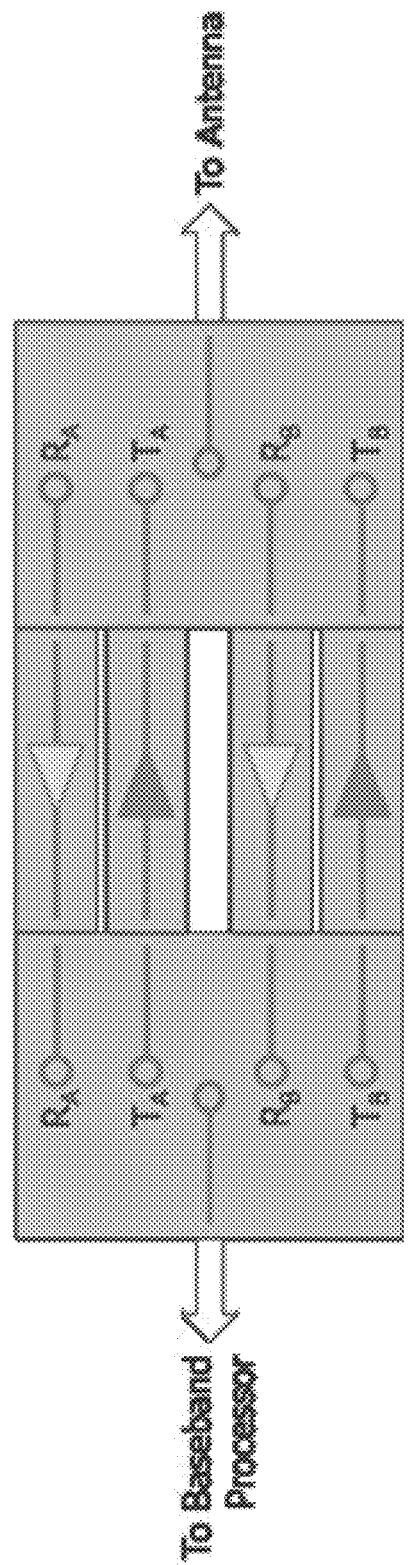
FIG. 21 is a schematic diagram of an exemplary dual-band transmit/receive module.

FIG. 20 is a top down view of an exemplary single-pole, four throw RF switch, constructed in accordance with the present technology. FIG. 21 is a schematic diagram of an exemplary dual-band transmit/receive module.

By using the Dual-Gate Power Device of FIGS. 15 and 16, it is possible to extend the RF switch concept to multiple inputs and/or outputs. Consider the Multi-Port Power Device shown in FIG. 12. If such a device were configured as a Dual Power Device, it could be configured into a single-pole, four-throw switch as shown in FIG. 20.

By way of non-limiting example, the switch of FIG. 20 would be useful in a particular telecommunications application. Cellular phones today must be able to operate in different frequency bands so that they can take advantage of whatever cellular network coverage exists in a particular area. Suppose a given phone needs to operate in frequency bands A and B. This generally requires separate T/R modules optimized for each of the two frequency bands, and thus would imply separate antennas and baseband processors. However, using single-pole, four-throw switches a combined T/R module could utilize the same baseband processor and antenna, as illustrated in FIG. 21.

The dual-band T/R module of FIG. 21 comprises a single-pole, four-throw switch that is used to selectively guide the signal from the single antenna to the single baseband processor through the RA or RB path, depending on which frequency band the signal is in. In a similar fashion, the transmit signal may be directed through the TA or TB amplifier, as appropriate. For other applications, different combinations of multi-pole, multi-throw RF switches can be created using the same basic layout designs that have been discussed previously.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments. It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. A Field Effect Transistor (FET) cascode device comprising:
    a compound semiconductor layer;
    an ohmic metal layer comprising:
    a plurality of ohmic metal input drain fingers and output drain fingers disposed on a surface of the compound semiconductor layer,
    a plurality of ohmic metal input source fingers and output source fingers disposed on the surface of the compound semiconductor layer, the input source fingers alternating with the input drain fingers, and the output source fingers alternating with the output drain fingers, each of the plurality of input drain fingers integrally connected to a corresponding output source finger of the plurality of output source fingers, the input drain finger and corresponding, connected output source finger forming a continuous ohmic metal finger,
    a plurality of input gate fingers, each disposed on the surface of the compound semiconductor layer between adjacent input drain and source fingers,
    a plurality of output gate fingers, each disposed on the surface of the compound semiconductor layer between adjacent output drain and source fingers,
    a plurality of first and second input gate pads disposed at opposite ends of the plurality of input gate fingers to form a serpentine path, each of the first and second input gate pads configured to couple an input gate signal to two of the input gate fingers, each of the plurality of first input gate pads disposed between one of the plurality of input source fingers and a respective output drain finger, and a plurality of first and second output gate pads disposed at opposite ends of the plurality of output gate fingers to form a serpentine path, each of the first and second output gate pads configured to couple an output gate signal to two of the output gate fingers, each of the plurality of first output gate pads disposed adjacent at least one of the first input gate pads and between one of the plurality of input source fingers and a respective output drain finger; and a first metal layer comprising:
 an input pad electrically connected to the plurality of first and second input gate pads,
 a ground pad electrically connected to the plurality of input source fingers, and electrically coupled to the plurality of first and second output gate pads using a bypass capacitor, and
 an output pad electrically connected to the plurality of output drain fingers.

2. The cascode device of claim 1, wherein the output source finger and the input drain finger form a continuous ohmic metal finger including the direct electrical connection between the output source finger and the input drain finger.

3. The cascode device of claim 1, further comprising:
 a second metal layer disposed between the ohmic metal layer and the first metal layer, the second metal layer including a plurality of bypass ground electrodes;
 a first dielectric layer disposed between the second metal layer and the ohmic metal layer, the bypass ground electrodes electrically connected to the plurality of first and second output gate pads using a plurality of posts; and
 a second dielectric layer separating the first metal layer from the second metal layer, the second dielectric layer forming the bypass capacitor between the bypass ground electrodes and the ground pad in the first metal layer.

4. The cascode device of claim 3, wherein the second dielectric layer is silicon dioxide.

5. The cascode device of claim 3, wherein the second metal layer further comprises:
 a plurality of output drain electrodes electrically connected to the output drain fingers using a plurality of posts, the output drain electrodes electrically connected to the output pad in the first metal layer using a plurality of vias; and
 a plurality of input source electrodes electrically connected to the input source fingers using a plurality of posts, the input source electrodes electrically connected to the ground pad in the first metal layer using a plurality of vias.

6. The cascode device of claim 3, wherein the second metal layer further comprises:
 a first gate electrode electrically connected to the plurality of first gate pads using a plurality of posts, the first gate electrode electrically connected to the input pad in the first metal layer using one or more vias; and
 a second gate electrode electrically connected to the second gate pads using a post and electrically connected to the input pad in the first metal layer using one or more vias.

7. The cascode device of claim 1, wherein a length of each of the plurality of gate fingers is less than about 0.5 microns.

8. The cascode device of claim 1, wherein a length of each of the plurality of source fingers is less than about 7 microns.

9. The cascode device of claim 1, further comprising a plurality of output drain electrodes disposed along a width of the output drain fingers and oriented to cross the plurality of output drain fingers about normally, each output drain electrode electrically coupled through at least one post to a section of each of the output drain fingers and through at least one via to the output pad.

10. The cascode device of claim 1, further comprising a plurality of input source electrodes disposed along a width of the input source fingers and oriented to cross the plurality of input source fingers about normally, each input source electrode electrically coupled through at least one post to a section of each of the plurality of input source fingers and through at least one via to the ground pad.

11. The cascode device of claim 1, wherein the compound semiconductor layer is gallium arsenide or gallium nitride.

12. A method for amplifying a signal using an input FET and output FET in a cascode configuration, the method comprising:
 partitioning an output current into a plurality of current segments;
 distributing the plurality of current segments from an output pad to sections of an output electrode, the current segments distributed through a plurality of vias distributed along a first surface of the output electrode;
 conducting the plurality of current segments from the sections of the output electrode to a plurality of output drain elements of a cascode output FET, the output drain elements arrayed along the output electrode, the current segments conducted from the output electrode through a plurality of posts distributed along a second surface of the output electrode to respective output drain elements;
 bypassing a plurality of output gates to a ground pad referenced to ground using a bypass capacitor, each of the output gates disposed between an output drain element of the plurality of output drain elements and an output source element of a plurality of output source elements, the output source elements alternating with the output drain elements, the bypassing further comprising:
  coupling the ground pad via the bypass capacitor to an output gate electrode,
  coupling the output gate electrode to a plurality of first and second output gate pads through a plurality of posts,
  coupling each of the first output gate pads to a first end of two of the plurality of output gates,
  coupling each of the second output gate pads to a second end of two of the plurality of output gates, and
  coupling each of the output gates to at least one of the first and one of the second output gate pads;
 controlling conduction of the plurality of current segments from the output drain elements to the plurality of output source elements using the output gates;
 conducting the current segments along continuous ohmic metal fingers from the output source elements of the cascode output FET to a plurality of corresponding input drain elements of the cascode input FET, each output source element and corresponding input drain element forming a single continuous ohmic finger, the input drain elements alternating with a plurality of input source elements;
 coupling an input signal to a plurality of input gates each disposed between an input drain element of the plurality of input drain elements and an input source element of the plurality of input source elements, the input signal coupled to a plurality of first and second input gate pads, each of the first input gate pads coupled to a first end of two of the plurality of input gates, each of the second input gate pads coupled to a second end of two of the plurality of input gates, each of the input gates coupled to at least one of the first and one of the second input gate pads, each of the first input and first output gate pads disposed between an output drain element and input source element;

modulating the plurality of current segments from the input drain elements to the input source elements using the input gates;

conducting the modulated current segments from the plurality of input source elements to a ground electrode through a plurality of posts; and conducting the current segments from the sections of the ground electrode through a plurality of vias distributed along the sections of the ground electrode to the ground pad.

13. The method of claim 12, further comprising removing heat from the cascode output FET and the cascode input FET through a plurality of output drain electrodes, a plurality of input source electrodes, and an output ground electrode and a ground electrode.

14. The method of claim 12, wherein the cascode output FET and the cascode input FET are fabricated on a piece of gallium arsenide or gallium nitride.

15. The method of claim 12, wherein the bypass capacitor is formed by a dialectic layer disposed between the output gate electrode and the ground pad.

16. A dual Field Effect Transistor (FET) cascode device comprising:
  a compound semiconductor layer;
  an ohmic metal layer comprising:
    an ohmic metal input drain finger and an ohmic metal input source finger disposed on a surface of the compound semiconductor layer,
    an input gate finger disposed between the input drain finger and the input source finger,
    a first and a second input gate pad disposed at opposite ends of the input gate finger, the first and second input gate pads in electrical contact with the input gate finger,
    an ohmic metal output drain finger and an ohmic metal output source finger disposed on the surface of the compound semiconductor layer,
    an output gate finger disposed between the output drain finger and the output source finger,
    a first and a second output gate pad at opposite ends of the output gate finger, the first and second output gate pads in electrical contact with the output gate finger,
    the first input gate pad and the first output gate pad disposed between the input source finger and the output drain finger, and
    a direct electrical connection between the input drain finger and the output source finger; and
  a first metal layer comprising:
    an input pad electrically connected to the first and second input gate pads,
    a ground pad electrically connected to the input source finger, and electrically coupled to the first and second output gate pads using a bypass capacitor, and
    and an output pad electrically connected to the output drain finger.

17. The cascode device of claim 16, wherein the output source finger and the input drain finger form a continuous ohmic metal finger including the direct electrical connection between the output source finger and the input drain finger.

18. The cascode device of claim 16, further comprising:
  a second metal layer disposed between the ohmic metal layer and the first metal layer, the second metal layer including a bypass ground electrode;
  a first dielectric layer disposed between the second metal layer and the ohmic metal layer, the bypass ground electrode electrically connected to the first and second output gate pads using a post; and
  a second dielectric layer separating the first metal layer from the second metal layer and forming the bypass capacitor between the bypass ground electrode and the ground pad in the first metal layer.

19. The cascode device of claim 18, wherein the second dielectric layer is silicon dioxide.

20. The cascode device of claim 18, wherein the second metal layer further comprises:
  an output drain electrode electrically connected to the output drain finger using a post and electrically connected to the output pad in the first metal layer using a via; and
  an input source electrode electrically connected to the input source finger using a post and electrically connected to the ground pad in the first metal layer using a via.

21. The cascode device of claim 18, wherein the second metal layer further comprises:
  a first gate electrode electrically connected to the first gate pad using a post and electrically connected to the input pad in the first metal layer using a via; and
  a second gate electrode electrically connected to the second gate pad using a post and electrically connected to the input pad in the first metal layer using a via.

* * * * *